US010114400B2

(12) United States Patent
Lacy et al.

(10) Patent No.: US 10,114,400 B2
(45) Date of Patent: Oct. 30, 2018

(54) BAND-GAP REFERENCE CIRCUIT WITH CHOPPING CIRCUIT

(71) Applicant: Synopsys, Inc., Mountain View, CA (US)

(72) Inventors: Cameron Lacy, Milton (CA); Michael W. Lynch, Toronto (CA); Sergei Uhanov, Mississauga (CA)

(73) Assignee: Synopsys, Inc., Mountain View, CA (US)

( * ) Notice: Subject to any disclaimer, the term of this patent is extended or adjusted under 35 U.S.C. 154(b) by 118 days.

(21) Appl. No.: 15/282,339

(22) Filed: Sep. 30, 2016

(65) Prior Publication Data

US 2018/0095491 A1 Apr. 5, 2018

(51) Int. Cl.

| | |
|---|---|
| ***G05F 1/10*** | (2006.01) |
| ***G05F 3/02*** | (2006.01) |
| ***G05F 3/26*** | (2006.01) |
| ***H03K 17/687*** | (2006.01) |
| ***H03F 3/38*** | (2006.01) |

(52) U.S. Cl.

CPC ............... *G05F 3/262* (2013.01); *H03F 3/38* (2013.01); *H03K 17/6872* (2013.01)

(58) Field of Classification Search

CPC . G05F 3/30; G05F 3/267; G05F 3/262; G05F 3/205; G11C 5/147

USPC ................................. 327/539; 323/313, 315

See application file for complete search history.

(56) References Cited

U.S. PATENT DOCUMENTS 7,342,390 B2 * 3/2008 Tachibana ................. G05F 3/30 323/313
7,446,598 B2 * 11/2008 Pertijs .................... G01K 7/015 327/512
2006/0055381 A1 * 3/2006 Rice ...................... H02M 3/285 323/271
2006/0164158 A1 * 7/2006 Kimura ..................... G05F 3/30 327/539

(Continued)

OTHER PUBLICATIONS

Banda et al. "A CMOS Bandgap Reference Circuit With Sub-1-V Operation" IEEE vol. 34, No. 5, May 1999, pp. 670-674.

(Continued)

*Primary Examiner* — Quan Tra
(74) *Attorney, Agent, or Firm* — Bever, Hoffman & Harms, LLP

(57) ABSTRACT

A BGR circuit for sub-1V ICs utilizes a voltage chopping circuit and/or a current chopping circuit and a low-frequency filter to stabilize the output reference voltage that is generated by an op-amp, a current mirror circuit, a CTAT stage, a PTAT stage, and an output stage. The voltage chopping circuit reduces input offset and 1/f noise by periodically alternating (time-averaging) the negative temperature dependent and positive temperature dependent voltages supplied by the CTAT and PTAT stages to the op-amp's input terminals. The current chopping circuit minimizes current variations caused by process-related differences in the current mirror devices by periodically alternating (time-averaging) three balanced currents generated by the current mirror circuit such that each current is transmitted equally to each of the CTAT, PTAT and output stages. The filter serves to maintain loop stability and remove the low frequency noise generated by the applied voltage and/or current chopping operations.

16 Claims, 11 Drawing Sheets

(56) References Cited

U.S. PATENT DOCUMENTS

| | | | | |
|---|---|---|---|---|
| 2007/0252573 | A1* | 11/2007 | Tachibana | G05F 3/30 323/313 |
| 2009/0284242 | A1* | 11/2009 | Motz | H03F 1/0205 323/313 |

OTHER PUBLICATIONS

Pelgrom et al. "Matching Properties of MOS Transistors" IEEE vol. 24, No. 5, Oct. 1989, pp. 1433-1440.

* cited by examiner

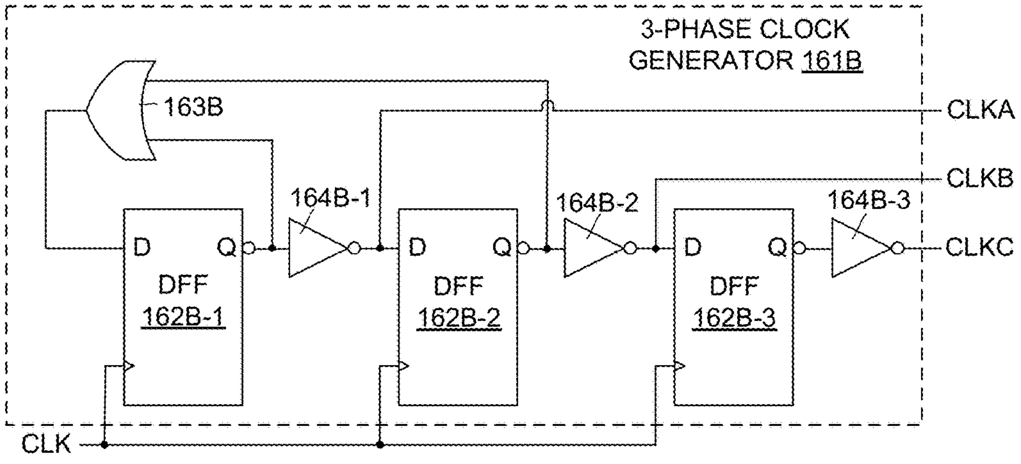
FIG. 6
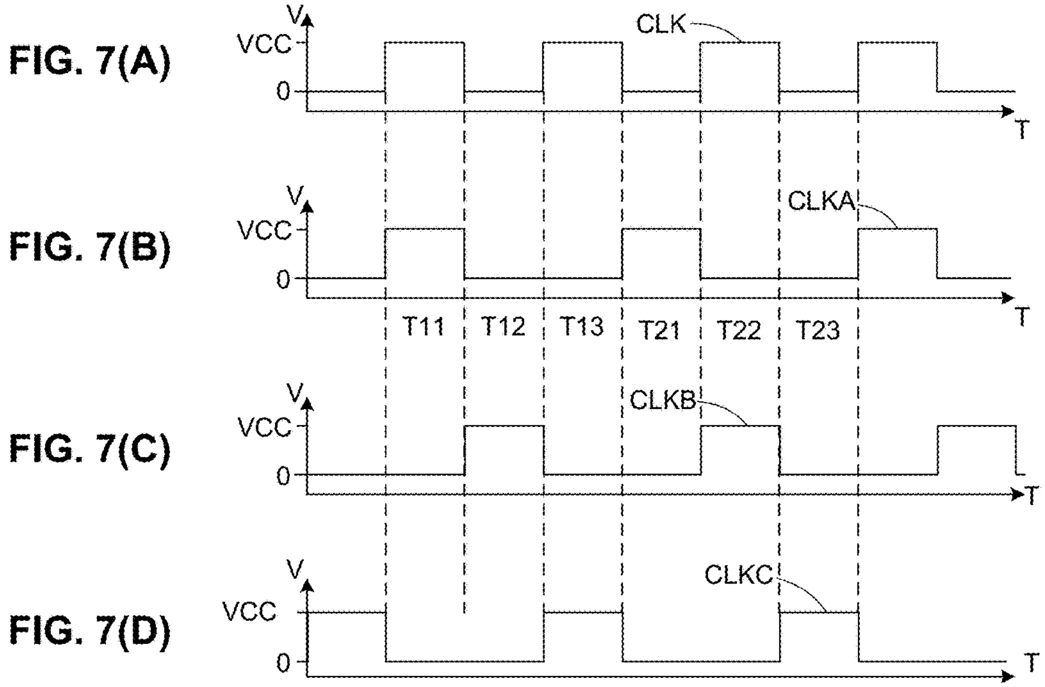

BAND-GAP REFERENCE CIRCUIT WITH CHOPPING CIRCUIT

FIELD OF THE INVENTION

The present invention is directed to bandgap reference (BGR) circuits, and more particularly to current-mode BGR circuits.

BACKGROUND OF THE INVENTION

Bandgap reference (BGR) circuits are utilized in host integrated circuits (ICs) to generate temperature-stabilized (temperature independent) reference voltages that are used by other circuitry of the host ICs. Conventional BGR circuits are generally classified as current-mode BGR circuits and voltage-mode BGR circuits. Both types of conventional BGR circuits generate a temperature-stabilized reference voltage/current by way of combining two voltages/currents having two opposite temperature coefficients, where the two voltages/currents include a positive temperature dependent voltage/current that rises in proportion to increases in absolute temperature (sometimes referred to as Proportionate to Absolute Temperature (PTAT) voltages), and a negative temperature dependent voltage/current that decreases as the temperature rises (sometimes referred to as Complementary to Absolute Temperature (CTAT) voltage/current). The PTAT and CTAT partial voltage/currents are then combined such that the opposite (positive/increasing and negative/decreasing) temperature coefficients of the PTAT and CTAT voltage/currents function to cancel each other, whereby variations of the temperature-stabilized reference voltage are significantly reduced. The two types of conventional BGR circuits differ in that, in current-mode BGR circuits, the reference voltage is derived from the sum of PTAT and CTAT currents, and in voltage-mode BGR circuits, the reference voltage is derived from the sum of PTAT and CTAT voltages.

FIG. 14 depicts a conventional current-mode bandgap reference (BGR) circuit 50 that is described by Banba et al. in "A CMOS bandgap reference circuit with sub-1-V operation" (IEEE J. of Solid-State Circuits, vol. 34 pp. 670-674, May 1999). Current-mode BGR circuit 50 includes an operational amplifier (op-amp) 51, a current mirror circuit 52 including three matched current source devices P1, P2 and P3, a negative temperature coefficient (CTAT) stage 53, a positive temperature coefficient (PTAT) stage 54, and an output stage 55. Op-amp 51 is of a type exhibiting an infinite DC gain and zero offset voltage for the applicable operating conditions. Current source devices (e.g., matched PMOS transistors) P1, P2 and P3 have gate terminals connect to an output terminal of op-amp 51 such that devices P1, P2 and P3 are controlled by op-amp output signal OA-OUT to respectively pass currents I1, I2 and I3 to stages 53, 54 and 55. CTAT stage 53 includes a single diode D1 and a resistor R1 that are connected in parallel between device P1 and ground such that portions Ia1 and Ia2 of current I1 respectively pass through diode D1 and resistor R1. Partial current I1*a* is a CTAT current controlled by voltage Vf1 across diode d1. With this arrangement, diode D1 and resistor R1 are configured to generate a negative temperature dependent voltage Va (sometimes referred to as a complementary-to-absolute-temperature, or CTAT, voltage) that is proportional to voltage Vf1, and therefore decreases as the operating temperature of the host IC increases. PTAT stage 54 includes multiple parallel-connected diodes D2 (each diode matching diode D1), a resistor R2, and a resistor R3 that are connected between device P2 and ground such that a first portion 2*a*1 of current I2 passes through resistor R3 and diode D1, and a second portion 2*a*2 of current I2 passes through resistor R2. Partial current I2*b* is a PTAT current controlled by voltage Vf2 across diodes D2 and dVf across resistor R3. Resistors R1 and R2 are formed with matching resistance values. PTAT stage 54 generates a positive temperature dependent (aka, PTAT) voltage Vb that is made proportional to the thermal voltage $V_T$ (i.e., a positive temperature coefficient of 0.086 mV/° C.) by way of generating a voltage Vf2 across multiple (N) parallel-connected diodes D2. Negative temperature dependent voltage Va is passed to the non-inverting (+) input terminal of op-amp 51, and positive temperature dependent voltage Vb is passed to the inverting (−) input terminal of op-amp 51. With this arrangement, and by forming resistor R3 with an appropriate R1/R3 ratio and by forming diodes D2 with an appropriate number N of diodes, a linear compensation of the temperature dependence of currents I1 and I2 is achieved, and bandgap reference voltage Vref is therefore generated by passing current I3 through resistor R4, where the magnitude of voltage Vref is adjustable for different applications by way of changing the size of resistor R4 (i.e., Vref=R4 (Vf1/R2+dVf/R3). An advantage of this scheme is that current-mode BGR circuit 50 generates partial currents I1 and I2 using a balanced circuit and only one control loop implemented by a CMOS operational amplifier 51.

In practical applications, a problem associated with conventional current-mode BGR circuit 50 is that the output current I3 is inherently mismatched with currents I1 and I2 due to differences in $V_{DS}$ of the current source devices P1, P2 and P3. Further, conventional current-mode BGR circuit 50 is subject to the low frequency (1/f) noise and to random threshold voltage variations between current source devices P1, P2 and P3, and also at the inputs of op-amp 52. One possible approach for removing the mismatch between output current I3 and currents I1 and I2 is to configure PTAT stage 54 and output stage 55 such that positive temperature dependent voltage Vb is equal to reference voltage Vref. While this solution approach may be theoretically possible, it is impractical because it would significantly increase the size (silicon area) occupied by the BGR circuit by way of requiring an extra op-amp circuit, and precludes the option of selectively setting the desired value of Vref (i.e., by way of implementing resistor R4 with different voltages) without sacrificing accuracy. Another approach may be to utilize the cascoding technique to increase the output impedance, but this solution is very limited in low power supply (sub-1V) voltage applications (e.g., 1V or less). The 1/f (aka "flicker") noise problems caused by random noise variations and random threshold voltage variations in the current mirror, traditionally, are addressed by enlarging the sizes of the current source devices P1, P2, P3 devices (i.e., because the Vth mismatch is inversely proportional to square root of gate area and flicker noise power is inversely proportional to gate area). However, this solution is costly both in terms of silicon area (i.e., the size of the BGR circuit is greatly increased) and extra parasitic capacitance. Another possible approach is to increase the gate-source voltage of the PMOS current source devices with the purpose of increasing the overdrive voltage, making Vth a smaller fraction of the total Vgs (see M. J. M. Pelgrom, A. C. J. Duinmaijer and A. P. G. Welbers, "Matching properties of MOS transistors", IEEE Journal of Solid-state Circuits, vol. SC-24, pp. 1433-1440, 1989). However, as mentioned above, this solution "eats" into the headroom of the current source devices that defeats the purpose of having low voltage supply-based BGR.

What is needed is a BGR circuit that overcomes the above-mentioned deficiencies of conventional BGR circuits. In particular, what is needed is a BGR circuit that facilitates the use of low (e.g., sub-1V) supply voltages without requiring a significant increase in the chip area occupied by the BGR circuit, and also facilitates choosing a desired voltage reference level without sacrificing accuracy.

SUMMARY OF THE INVENTION

The present invention is directed to a novel BGR circuit that utilizes at least one of a voltage chopping technique and a current chopping technique to overcome the deficiencies of conventional BGR circuits. The novel BGR circuit generally includes a single op-amp, a current mirror circuit, a negative temperature coefficient (CTAT, first) stage, a PTAT (second) stage, and an output (third) stage that are configured and arranged in a manner similar to that utilized in a conventional current-mode BGR circuit. To implement the voltage and/or current chopping techniques, the novel BGR circuit also includes a voltage chopping circuit and/or a current chopping circuit and a low-frequency filter. The voltage chopping technique involves periodically alternating (time-average) the negative temperature dependent and positive positive temperature dependent voltages supplied to the input terminals of the op-amp in order to reduce the input offset and 1/f noise associated with operation of the op-amp circuit. The current chopping technique involves periodically alternating (time-averaging) the three currents generated by the current mirror circuit such that each of the three currents are alternately transmitted to each of the CTAT (negative temperature coefficient) stage, the PTAT (positive temperature coefficient) stage, and the output (third) stage, thereby minimizing variations due to $V_{as}$ differences of the current source devices, and minimizing the low frequency (1/f) noise due to random threshold voltage variations between the current source devices. The filter is configured to remove the low frequency noise in output (voltage reference) signal that is generated by the voltage and/or current chopping operations. When at least one of the voltage chopping technique and the current chopping technique are implemented, the resulting modified BGR circuit exhibits measurably improved reference voltage stability in comparison to conventional BGR circuits. When both the voltage chopping technique and the current chopping technique are utilized in combination, the present invention provides a low supply voltage BGR circuit exhibiting an order-of-magnitude improvement in reference voltage stability over that produced by conventional BGR circuits, a size that is minimally larger than conventional BGR circuits, and also facilitates selectively changing the reference voltage level without sacrificing accuracy.

According to an embodiment of the invention, the novel BGR circuit utilizes a voltage chopping circuit including both an input voltage chopper and an output voltage chopper. The essence of the voltage chopping technique is swapping the negative and positive temperature dependent voltages applied to the op-amp input terminals, which is accomplished by the input voltage chopper. The input voltage chopper is a switching circuit coupled between the input terminals of the op-amp and the CTAT and PTAT stages, and performs the function of periodically alternating transmission of the negative temperature dependent and positive temperature dependent voltages to the input terminals of the op-amp in accordance with a control signal (e.g., an externally supplied (first) clock signal). Specifically, during a first time period (e.g., each positive phase of the clock signal), the input voltage chopper switches into a first operating state that transmits the negative temperature dependent voltage to the non-inverting (first) op-amp input terminal and transmits the positive temperature dependent voltage to the inverting (second) op-amp input terminal. During a subsequent second time period (e.g., each negative phase of the clock signal), the input voltage chopper switches into a second operating state that transmits the negative temperature dependent voltage to the inverting (second) op-amp input terminal and to transmit the positive temperature dependent voltage to the non-inverting (first) op-amp input terminal. By definition the amplitude of 1/f noise is inversely proportional to frequency, so any appreciable 1/f noise amplitude will occur at low frequencies only. That is why traditionally 1/f noise is treated the same way as threshold offset noise, and these two noise sources are lumped in one phenomenon and dealt with together. According to the present embodiment, the op-amp input voltage chopping operation reduces the input offset and 1/f noise associated with operation of the op-amp by causing the op-amp to generate a first (e.g., positive phase) output signal during each first time period (e.g., positive clock phase), and to generate a second (e.g., negative phase) output signal during each second time period (e.g., negative clock phase). That is, swapping the op-amp input signals reduces the 1/f noise by up-converting the 1/f noise to a higher (swapping) frequency, whereby the up-converted frequency is then suppressed (i.e., reduced by 50% or more) by the filter. For example, if one transistor of the differential input pair has a threshold voltage that is offset by a fixed amount from the other transistor, swapping the input signals effectively eliminate the offset. In some instances (e.g., in the case of single stage op-amp circuits), swapping the negative and positive temperature dependent voltages supplied to the op-amp requires the use of a second chopper to periodically alternate (swap) the corresponding first (e.g., positive phase) and second (e.g., negative phase) output signals generated by the op-amp. The output voltage chopper performs this function in such cases, and comprises a second switching circuit coupled between the op-amp and the current mirror circuit that is configured to periodically alternating transmission of the first (e.g., positive phase) and second (e.g., negative phase) output signals generated by the op-amp to the current source devices by way of a gate control line in accordance with the same control signal (e.g., the same clock signal) that is utilized to control the input voltage chopper. Specifically, during the first time period (e.g., each positive phase of the clock signal), the output voltage chopper switches into a first operating state that transmits the first (e.g., positive phase) output signal to the current mirror circuit by way of the gate control line, and during the second time period (e.g., each negative phase of the clock signal), the output voltage chopper switches into a second operating state such that the second (e.g., negative phase) output signal is transmitted onto the gate control line. In one embodiment, a low-frequency input filter (e.g., a capacitor), which is configured to maintain loop stability and suppress low frequency noise generated by operation of the voltage chopping circuit, is connected between the gate control line and the voltage source.

According to another embodiment, the novel BGR circuit also includes the current chopping circuit, which comprises a three-phase clock generator and a three-phase switching circuit. The three-phase clock generator is configured to generate three clock signals that are repeatedly alternately asserted according to a three-phase clock cycle (i.e., such that each of the three clock signals is asserted (high) during an associated one of the three phases making up the three-phase cycle. The three-phase switching circuit is connected at one end to the three signal lines that transmit the three balanced currents from the current mirror, and at the other end to the CTAT, PTAT and output stages, and is configured to couple each of the three currents to a corresponding one of the CTAT, PTAT and output stages during each phase of the three-phase cycle (e.g., one current is passed to the CTAT stage during each first phase, to the PTAT stage during each second phase, and to the output stage during each third phase of the three-phase cycle). In this embodiment, the BGR circuit also includes an output filter (e.g., an RC filter circuit coupled to the output (third) stage) that is configured to filter out the low-frequency noise generated by operation of the current chopping circuit. A common assumption in the operation of a conventional current-mode BGR circuit is that the three current mirror transistors are ideal current sources and they are matched in current they deliver. In real life, they are not ideal and they are not matched because a) due to physical imperfections their threshold voltages are different, creating voltage offsets, and they are also subject to random 1/f noise; and b) they are not ideal current sources because ideal current source delivers current independently of the voltage across it—because the third (output) stage has a $V_{DS}$ that is different from the PTAT and CTAT stages, due to limited output impedance of the PMOS current source device feeding the output (third) stage, its current will differ from the other two stages (i.e., the higher $V_{DS}$ of the PTAT and CTAT stages will produce higher current). The current chopping circuit thus functions to increase reference voltage stability by periodically and repeatedly alternating (time-averaging) the transmission of the three current-mirror currents to the CTAT stage, the PTAT stage, and the output (third) stage, thereby minimizing the effects of current variations caused by $V_{DS}$ and random threshold voltage variations between the current source devices.

According to a presently preferred embodiment, a BGR circuit implements both voltage chopping and current chopping operations (referred to herein as "double-chopping"), with the three-phase clock signals generated by a suitable generator circuit (e.g., a modified ring counter circuit) that is controlled by (i.e., synchronized to) the (first) clock signal utilized to control the voltage chopping circuit in the manner described above, where the three-phase generator circuit is further configured such that a second clock signal is asserted (high) only during a first (e.g., first positive) phase of the first clock signal, a third clock signal is asserted only during a subsequent second (e.g., first negative) phase of the first clock signal, and a fourth clock signal is asserted only during a subsequent third (e.g., second positive) phase of the first clock signal. By synchronizing the three-phase current chopping operation to the two-phase voltage chopping operation in this manner, the resulting BGR circuit achieves full averaging of the op-amp inputs/outputs and the three current-mirror currents transmitted to the CTAT, PTAT and output stages. That is, as explained above the two-phase op-amp input voltage chopping operation causes the op-amp to generate one of two alternating output signals during each positive phase and the other alternating output signal during each negative phase of the first clock signal). Because the current mirror generates the three current-mirror currents in response to the op-amp output signal, the three current-mirror currents are effectively periodically alternately changed between two values (i.e., positive phase current values and negative phase currents) during each two-phase voltage chopping cycle that correspond with the alternating op-amp output signals. Moreover, because each three-phase current-chopping operation is repeated every 1.5 cycles of the two-phase voltage chopping operation, the positive phase current values and negative phase currents are alternated each sequential three-phase clock cycle. This double-chopping technique (i.e., by combining two-phase voltage chopping and three-phase current chopping operations) functions to highly effectively modulate the (1/f) noise, the voltage offset and the output impedance mismatch of the op-amp and the current mirror devices, and the low-frequency noise generated by the double-chopping operation is then suppressed (filtered out) by the input and output filters, whereby BGR circuits produced in accordance with the present invention are able to generate highly stable reference voltages.

According to disclosed exemplary embodiments discussed below, the present invention is described with reference to a current-mode BGR circuit configuration that utilizes specific op-amp, clock-generation and switching circuit configurations that implement the voltage and current chopping operations (summarized above) in a manner believed to minimize size (chip area). In one embodiment, the op-amp is implemented using a single-stage op-amp circuit arrangement, and both the input and output voltage choppers are implemented using CMOS switches controlled by the first clock and clock-bar (i.e., inverted clock) signals. In this case, because the first (e.g., positive phase) output signal and the second (e.g., negative phase) output signal are generated on two internal nodes of the single-stage op-amp circuit, the output voltage chopper includes a first switch pair configured to couple one of the two nodes to the gate control line while a second switch pair simultaneously couples the other of the two nodes to provide a required load device connection (i.e., to diode-connect the pull-up PMOS feeding the other of the two nodes). In another embodiment the three-phase clock generator is implemented using a modified ring counter circuit that reliably generates the three-phase clock cycle using minimal chip area, and the three-phase switching circuit is implemented using three switch groups made up of CMOS switches that are respectively controlled by the three clock signals. While each of these specific circuits is believed to further enhance the performance and/or practicality of the novel BGR circuit, the various functions performed by these specific circuits may be implemented using other circuit types known to those skilled in the art, and are therefore the specific circuits described below are not intended to be limiting unless otherwise specified in the appended claims.

BRIEF DESCRIPTION OF THE DRAWINGS

These and other features, aspects and advantages of the present invention will become better understood with regard to the following description, appended claims, and accompanying drawings, where:

FIG. 6 is a simplified circuit diagram showing a three-phase clock generator utilized by the BGR circuit of FIG. 1 according to another specific embodiment of the present invention;

FIGS. 7(A), 7(B), 7(C) and 7(D) are timing diagrams depicting clock signals generating during the operation of the three-phase clock generator of FIG. 6;

DETAILED DESCRIPTION OF THE DRAWINGS

The present invention relates to an improvement in BGR circuits. The following description is presented to enable one of ordinary skill in the art to make and use the invention as provided in the context of a particular application and its requirements. As used herein, the terms "coupled" and "connected" are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). As used herein, the terms "chopper" and "chopping circuit" are alternately used to reference electronic switching circuits that receive two or more direct current (DC) input signals by way of two or more input lines, and are controlled by one or more clock (or other control) signals to periodically alternate re-transmission of the two or more input signals onto two or more output lines such that each input signal is transmitted an equal (time-averaged) amount on each of the two or more output lines. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
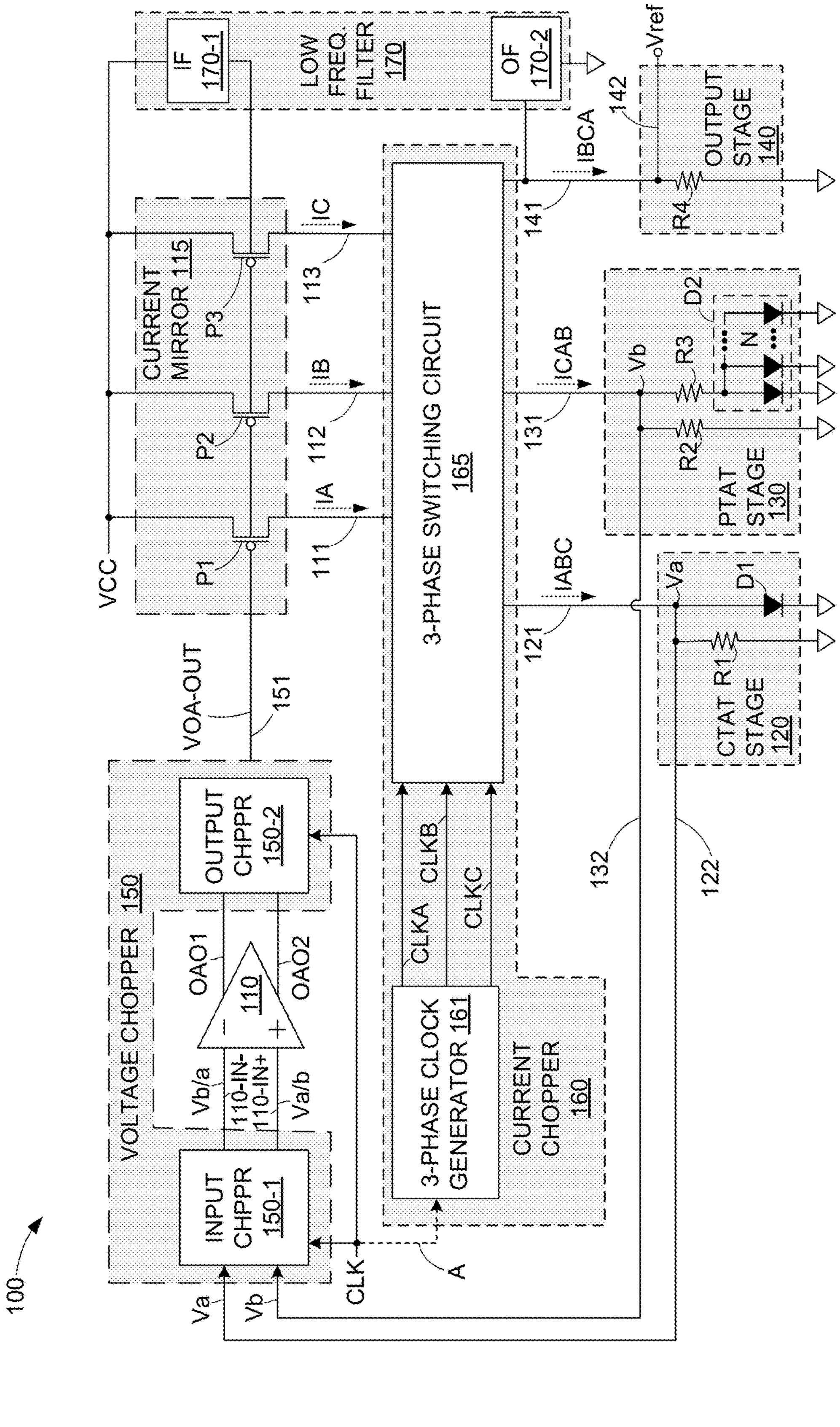
FIG. 1 is a simplified circuit diagram depicting a BGR circuit according to a generalized exemplary embodiment of the present invention.

FIG. 1 shows a generalized bandgap reference (BGR) circuit 100 including an operational amplifier (op-amp) 110, a current mirror circuit 115, a CTAT (negative temperature coefficient, first) stage 120, a PTAT (positive temperature coefficient, second) stage 130, an output (third) stage 140, a voltage chopping circuit 150 including an input voltage chopper 150-1 and an output voltage chopper 150-2, and a current chopping circuit including a 3-phase clock generator 161 and a three-phase switch circuit 165. Op-amp 110 includes an inverting input terminal 110-IN− and a non-inverting input terminal 110-IN+ and two output nodes OAO1 and OAO2. Current mirror 115 includes a first current source transistor P1, a second current source transistor P2 and a third current source transistor P3 having first terminals connected to system voltage source VCC and having gate terminals coupled by way of a gate control line 151 and output voltage chopper 150-2 to an output terminal of op-amp 110. Current source transistors P1, P2 and P3, which are implemented in the exemplary embodiment by matching PMOS transistors, are controlled by an op-amp output signal VOA-OUT that is passed onto gate control line 151 by output voltage chopper 150-2 to respectively generate a first current I1 on a first signal line 111, a second current I2 on a second signal line 112, and a third current I3 on a third signal line 113. Three-phase switch circuit 165 is connected to signal lines 111, 112 and 113, and is configured to periodically alternate the transmission of currents I1, I2 and I3 to CTAT stage 120, PTAT stage 130 and output stage 140, as indicated by alternating current IABC transmitted on line 121 to CTAT stage 120, alternating current ICAB transmitted on line 131 to PTAT stage 130, and alternating current IBCA transmitted on line 141 to output stage 140. CTAT stage 120 is thus coupled to current mirror circuit 115 by way of signal line 121 and three-phase switching circuit 165, and includes a diode D1 and resistor R1 configured to generate a negative temperature dependent voltage Va on signal line 122 in response to alternating current IABC, with negative temperature dependent voltage Va being coupled to the input terminals of op-amp 110 by way of input voltage chopper 150-1. PTAT stage 130 is similarly coupled to current mirror circuit 115 by way of signal line 131 and three-phase switching circuit 165, and includes N diodes D2 and resistors R2 and R3 that are configured to generate a positive temperature dependent voltage Vb on signal line 132 in response to alternating current ICAB, with positive temperature dependent voltage Vb being coupled to the input terminals of op-amp 110 by way of input voltage chopper 150-1. Output stage 140 includes a resistor R4 and is configured to generate reference voltage Vref, and is coupled to current mirror 115 by way of a signal line 141 and three-phase switching circuit 165. CTAT stage 120, PTAT stage 130 and output stage 140 are configured and operate substantially identically to stages 53, 54 and 55 of conventional current-mode BGR circuit 50 (described above), and therefore further details regarding the operation of these stages (sub-circuits) are omitted below for brevity.

Referring to the left side of FIG. 1, voltage chopping circuit 150 utilizes input voltage chopper 150-1 to periodically alternately apply ("swap") temperature dependent voltages Va and Vb to op-amp input terminals 110-IN− and 110-IN+, and utilizes output voltage chopper 150-2 to transmit one of two output signals from op-amp 110 to current mirror 115. As described in greater detail below, input voltage chopper 150-1 switches between two operating states in response to positive and negative phases of an applied clock signal CLK. During each positive phase of clock signal CLK, input voltage chopper 150-1 is operably configured in a first operating state that transmits negative temperature dependent voltage Va from signal line 122 to non-inverting op-amp input terminal 110-IN+ (i.e., input signal Va/b equals voltage Va) and transmits positive temperature dependent voltage Vb from signal line 132 to inverting op-amp input terminal 110-IN− (i.e., op-amp input signal Vb/a equals voltage Vb). During each negative phase of clock signal CLK, input voltage chopper 150-1 is operably reconfigured (switched) into a second operating state that transmits negative temperature dependent voltage Va to inverting op-amp input terminal 110-IN− and transmits positive temperature dependent voltage Vb to the non-inverting (first) op-amp input terminal 110-IN+. In some embodiments, swapping input voltages Va, and Vb in this way requires the utilization of the output voltage chopper 150-2 to periodically alternate (swap) a first (e.g., positive phase) and second (e.g., negative phase) output signals from op-amp output nodes OAO1 and OAO2 to current mirror circuit 115 by way of gate control line 151. Accordingly, as described below, output voltage chopper 150-2 also switches between two operating states in response to positive and negative phases of clock signal CLK. During each positive phase output voltage chopper 150-2 is operably configured in a first operating state that transmits a positive phase (first) output signal from output node OAO1 onto gate control line 151, and during each negative phase output voltage chopper 150-2 is operably reconfigured into a second operating state that transmits a negative phase (second) output signal from output node OAO2 onto gate control line 151. In this embodiment, an input filter (IF) 170-1 (e.g., a capacitor configured to maintain loop stability and remove low-frequency noise generated by operation of voltage chopping circuit 150) is connected between gate control line 151 and voltage source VCC.

Referring to current chopping circuit 160, three-phase switching circuit 165 is connected to signal lines 111, 112 and 113, and is configured to time-average the transmissions of balanced currents I1, I2 and I3 to CTAT stage 120, PTAT stage 130 and output 140 in accordance with a three-phase clock signal generated by three-phase clock generator 161. As described in additional detail below with reference to FIGS. 7(B) to 7(D), three-phase clock generator 161 is configured to generate (second) clock signal CLKA, (third) clock signal CLKB, and (fourth) clock signal CLKC such that only one of the three clock signals is asserted (high) during each phase of a three phase cycle. As indicated by the dashed-line arrow A in FIG. 1, in a presently preferred embodiment three-phase clock generator 161 is controlled by (synchronized to) clock signal CLK, but in some embodiments (e.g., in BGR circuit applications that omit op-amp voltage chopping) three-phase clock generator 161 may operate independent from clock signal CLK. Three-phase switching circuit 165 is connected between signal lines 111, 112 and 113 and a set of second signal lines 121, 131 and 141 that are respectively connected to CTAT stage 120, PTAT stage 130 and output stage 140. As described below with reference to FIGS. 9(A) to 9(F), three-phase switching circuit 165 is configured to time-average the transmission of balanced currents I1, I2 and I3 to CTAT stage 120, PTAT stage 130 and output stage 140 by way of second signal lines 121, 131 and 141 in accordance with clock signals CLKA, CLKB and CLKC.

Referring to the right side of FIG. 1, BGR circuit 100 also includes an optional output filter (OF) 170-2 (e.g., an RC filter circuit coupled to output stage 140) that is configured to filter out low-frequency noise generated by operation of the current chopping circuit 160. In double-chopping applications utilizing both voltage chopping circuit 150 and current chopping circuit 160, both input filter 170-1 (e.g., a capacitor) and output filter 170-2 are selected such that the input filter capacitor is designed to maintain loop stability, and the output filter RC circuit is selected to reliably cut off the chopping frequency.

Figure 2:
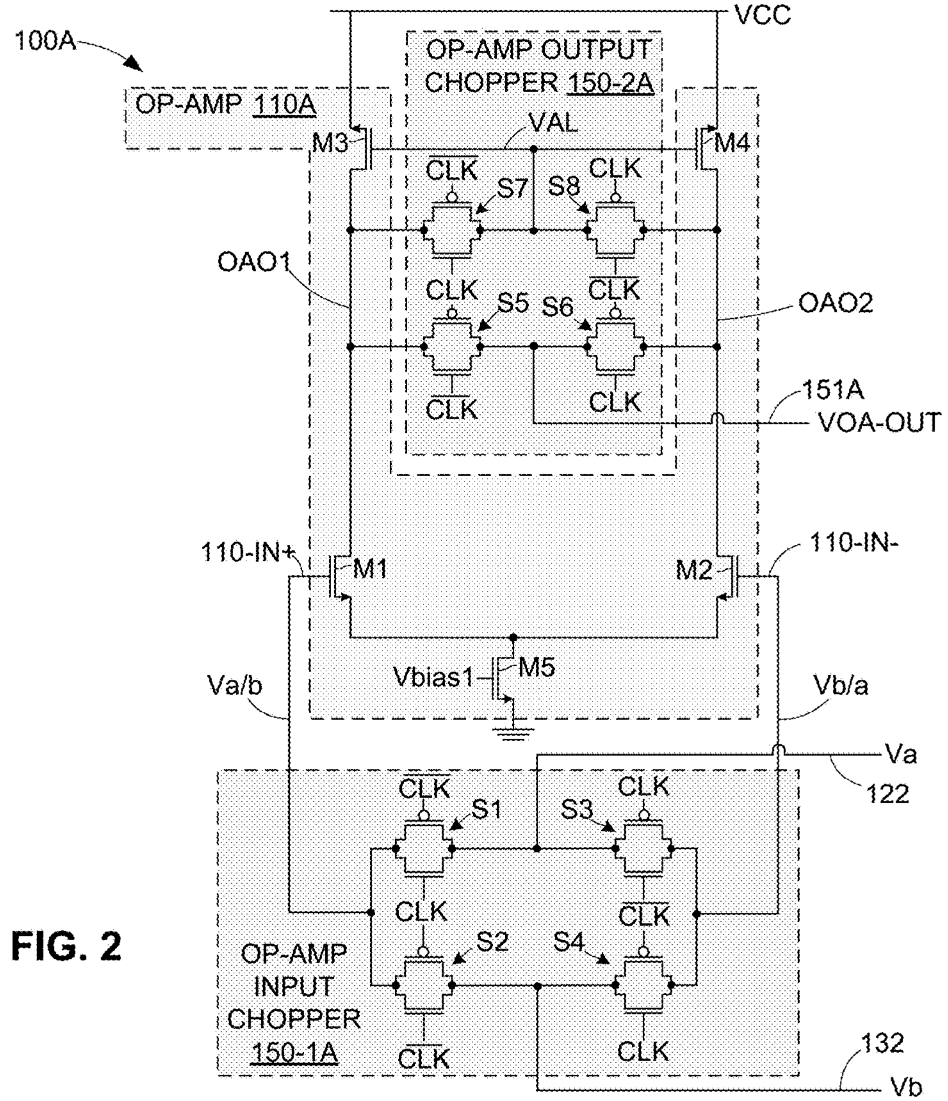
FIG. 2 is a partial circuit diagram showing an op-amp and voltage chopping circuit utilized by the BGR circuit of FIG. 1 according to a specific embodiment of the present invention.

FIG. 2 shows a portion of a BGR circuit 100A according to a specific embodiment including a one-stage op-amp circuit 110A, an input voltage chopper 150-1A and an output voltage chopper 150-2A.

Op-amp 110A includes a (first) pull-down NMOS transistor M1 and a (second) pull-down NMOS transistor M2 that are respectively coupled by way of a bias NMOS transistor M5 between output nodes OAO1 and OAO2 and ground, where the gate terminals of pull-down transistors M1 and M2 respectively form non-inverting (first) op-amp input terminal 110-IN+ and inverting (second) op-amp input terminal 110-IN−, and the gate terminals of bias transistor M5 are controlled by an associated bias signal Vbias1 according to known techniques. Op-amp 110A also includes a (first) pull-up PMOS transistor M3 and a (second) pull-up PMOS transistor M4 that are respectively connected between voltage source VCC and output nodes OAO1 and OAO2.

Figure 3A:
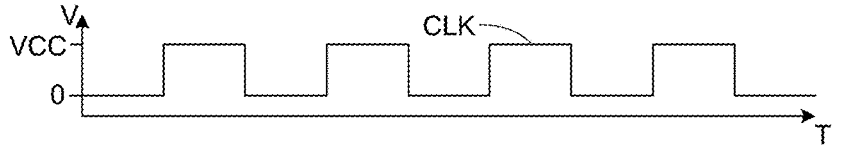
FIGS. 3(A), 3(B) and 3(C) are timing diagrams depicting clock, negative temperature dependent and positive temperature dependent signals, respectively, generated during the operation of the op-amp and voltage chopping circuits of FIG. 2.
Figure 3B:
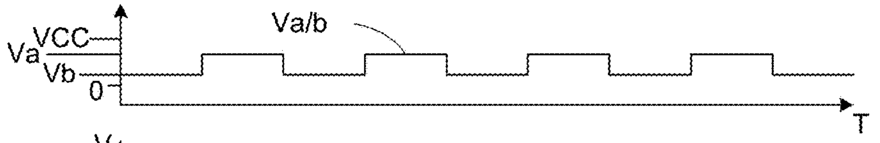
Figure 3C:
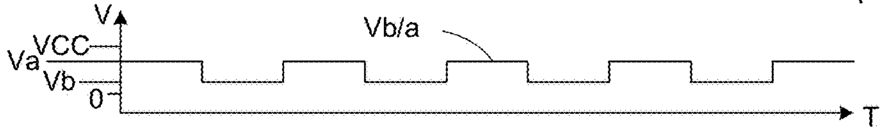
Figure 5A:
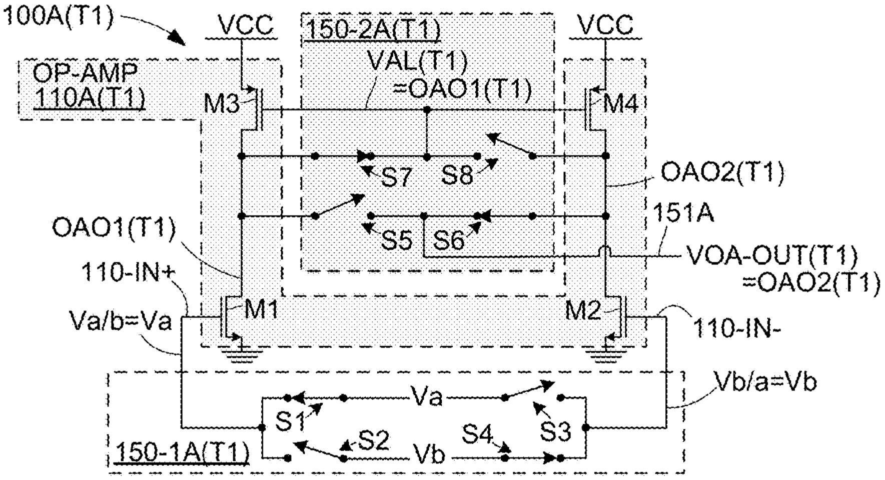
FIGS. 5(A) and 5(B) are simplified partial circuit diagrams showing alternate operating states of the op-amp and voltage chopping circuits of FIG. 2.
Figure 5B:
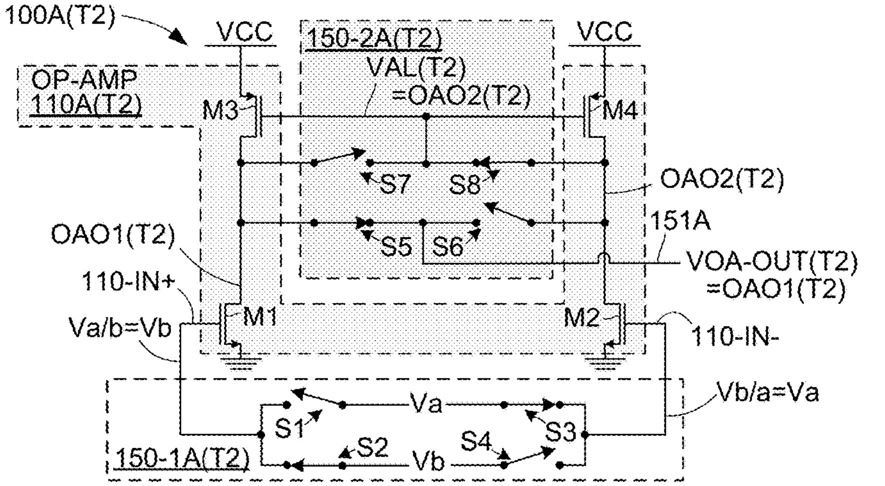

Referring to the lower portion of FIG. 2, input voltage chopper 150-1A includes four CMOS switches S1 to S4 that are controlled by clock signal CLK (and an inverted form of clock signal CLK, referred to herein as CLK-bar) to periodically alternately transmit temperature dependent voltages Va and Vb onto op-amp input terminals 110-IN+ and 110-IN−. Switches S1 and S2 are respectively connected between non-inverting input terminal 110-IN+ and signal lines 122 and 132, and are configured to generate input signal Va/b such that it periodically alternates between temperature dependent voltages Va and Vb in accordance with clock signal CLK. Switches S3 and S4 are respectively connected between inverting input terminal 110-IN− and signal lines 122 and 132, and are configured to generate input signal Vb/a such that it periodically alternates between positive temperature dependent voltage Vb and negative temperature dependent voltage Va in accordance with clock signal CLK. Switches S1 and S4 are configured to turn on (close) and switches S2 and S3 are configured to turn off (open) during positive phases of clock signal CLK, and switches S1 and S4 are configured to turn off (open) and switches S2 and S3 are configured to turn on (close) during negative phases of clock signal CLK FIGS. 3(A) to 3(C) illustrate the functional operation of input voltage chopper 150-1A, where FIG. 3(A) shows clock signal CLK, FIG. 3(B) shows input signal Va/b, and FIG. 3(C) shows input signal Vb/a. Note that negative temperature dependent voltage Va and positive temperature dependent voltage Vb are arbitrarily depicted in FIGS. 3(B) and 3(C) as having different voltage values with Va>Vb for illustrative purposes—during operation, voltage Vb may be greater than voltage Va, and ideally these two voltages are equal. Referring to FIGS. 2, 3(A) and 3(B), switches S1 and S2 are configured to generate input voltage Va/b such that it is equal to negative temperature dependent voltage Va during each positive phase of clock signal CLK, and is equal to positive temperature dependent voltage Vb during each negative phase of clock signal CLK. Similarly, referring to FIGS. 2, 3(A) and 3(C), switches S3 and S4 are configured to generate input voltage Vb/a such that it is equal to positive temperature dependent voltage Vb during each positive phase of clock signal CLK, and is equal to negative temperature dependent voltage Va during each negative phase of clock signal CLK. Accordingly, as depicted in FIG. 5(A), which shows BGR circuit 100A during a first time period "T1" corresponding to a positive (first) phase of clock signal CLK, (first) switch S1 is actuated to pass negative temperature dependent voltage Va to non-inverting op-amp input terminal 110-IN+ (i.e., input voltage Va/b=Va) and (fourth) switch S4 is simultaneously actuated to pass positive temperature dependent voltage Vb to inverting op-amp input terminal 110-IN− (i.e., input voltage Vb/a=Vb). Conversely, as depicted in FIG. 5(B), during a subsequent time period "T2" corresponding to the subsequent negative (second) phase of clock signal CLK, (second) switch S2 is actuated to pass temperature independent voltage Vb to non-inverting op-amp input terminal 110-IN+ (i.e., input voltage Va/b=Vb), and third switch S3 is actuated to pass negative temperature dependent voltage Va to inverting (second) op-amp input terminal 110-IN− (i.e., input voltage Vb/a=Va). As indicated in FIGS. 3(A) to 3(C), input voltages Va/b and Vb/a thereby periodically alternate between voltages Va and Vb in the manner depicted in FIGS. 5(A) and 5(B) during each cycle of clock signal CLK.

Referring to the upper central portion of FIG. 2, output voltage chopper 150-2 includes a (fifth) CMOS switch S5 and a (sixth) CMOS switch S6 that are configured to periodically alternately change op-amp output signal VOA-OUT in accordance with operation of input voltage chopper 150-1A by way of periodically alternately coupling output node voltages OAO1 and OAO2 to gate control line 151A. In addition, because op-amp 110A is a one-stage (single-ended output) op-amp circuit having an alternating active output signal on output nodes OAO1 and OAO2 that is generated by the alternating application of Va and Vb to pull-down NMOS transistors M1 and M2, it becomes necessary to also generate an alternating active load voltage VAL to diode-connect one of pull-up PMOS transistors M3 and M4 to the non-active output node. The function of generating alternating active load voltage VAL is performed by way of a (seventh) CMOS switch S7 coupled between output node OAO1 and the gate terminals of pull-up transistors M3 and M4, and an (eighth) CMOS switch S8 that is coupled between output node OAO2 and the gate terminals pull-up transistors M3 and M4. As explained below with reference to FIGS. 4(A) to 4(C), switches S7 and S8 are configured to generate alternating active load voltage VAL such that it is opposite to op-amp output signal VOA-OUT, thereby providing the required diode-connection during each phase of the voltage chopping operation.

Figure 4A:
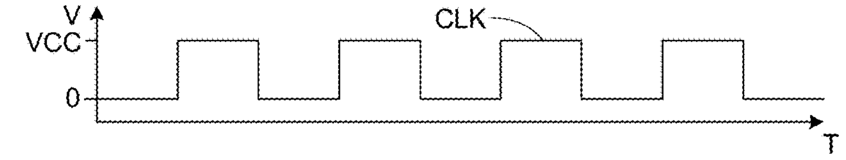
FIGS. 4(A), 4(B) and 4(C) are timing diagrams depicting clock, positive phase output and negative phase output signals generated during the operation of the voltage chopping circuit of FIG. 2.
Figure 4B:
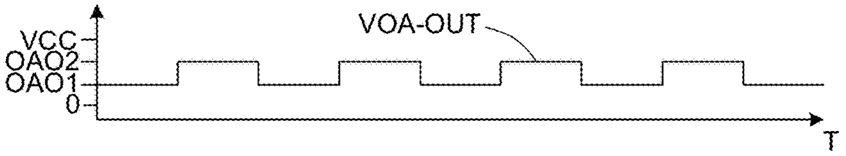
Figure 4C:
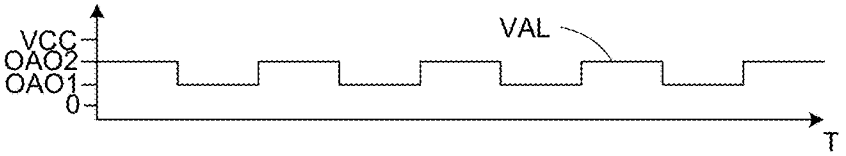

FIGS. 4(A) to 4(C) illustrate the functional operation of output voltage chopper 150-2A, where FIG. 4(A) shows clock signal CLK for reference, FIG. 4(B) shows op-amp output signal VOA-OUT, and FIG. 4(C) shows active load voltage VAL. Note that positive phase output voltage OAO1 and negative phase voltage OAO2 are arbitrarily depicted in FIGS. 4(B) and 4(C) as having different voltage values with OAO1>OAO2 for illustrative purposes—during operation, voltage OAO2 may be greater than voltage OAO1, and ideally these two voltages are equal. As indicated in FIGS. 4(A) and 4(B), op-amp output voltage VOA-OUT alternates between the active voltage generated on output node OAO2 during positive phases of clock signal CLK and the active voltage generated on output node OAO1 during negative phases of clock signal CLK. Conversely, as indicated in FIG. 4(C), active load voltage VAL alternates between the non-active voltage generated on output node OAO1 during positive phases of clock signal CLK and the non-active voltage generated on output node OAO2 during negative phases of clock signal CLK.

The operation of output voltage chopper 150-2A is further explained with reference to FIGS. 5(A) and 5(B). Referring to FIG. 5(A), during the first time period (T1), switch S6 is actuated by the positive phase of clock signal CLK such that gate control line 151A is coupled to output node OAO2, whereby output voltage VOA-OUT is equal to the active output signal generated by input voltage chopper 150-1A on output node OAO2 during time T1 (i.e., VOA-OUT(T1)=OAO2(T1)). At the same time, switch S7 is actuated by the positive phase of clock signal CLK such that the gate terminals of pull-up transistors M3 and M4 are coupled to output node OAO1, whereby active load voltage VAL is equal to the non-active output signal generated by input voltage chopper 150-1A on output node OAO1 during time T1 (i.e., VAL(T1)=OAO1(T1)). Subsequently, as indicated in FIG. 5(B), switch S6 is de-actuated and switch S5 is actuated by the negative phase of clock signal CLK during the second time period (T2) such that gate control line 151A is coupled to output node OAO1, whereby output voltage VOA-OUT is equal to the active output signal generated by input voltage chopper 150-1A on output node OAO1 during time T2 (i.e., VOA-OUT(T2)=OAO1(T2)). In addition, switch S7 is de-actuated and switch S8 is actuated by the negative phase of clock signal CLK such that the gate terminals of pull-up transistors M3 and M4 are coupled to output node OAO2, whereby active load voltage VAL is equal to the non-active output signal generated by input voltage chopper 150-1A on output node OAO2 during time T2 (i.e., VAL(T2)=OAO2(T2)).

FIG. 6 is a circuit diagram depicting a three-phase clock generator 161B that may be beneficially utilized by current chopping circuit 160 of BGR circuit 100 (FIG. 1). Three-phase clock generator 161B includes three D-flip-flops 162B-1, 162B-2 and 162B-3, an exclusive-OR logic gate 163B, and three inverters 164B-1, 164B-2 and 165B-3 configured in the manner shown in FIG. 6 to form a modified ring counter circuit that reliably generates clock signals CLKA, CLKB and CLKC according to the three-phase clock cycle depicted in FIGS. 7(B) to 7(D). That is, three-phase clock generator 161B is configured such that only (second) clock signal CLKA is asserted (high) during a first phase T11 of the three-phase cycle, such that only (third) clock signal CLKB is asserted during a second phase T12 of the three phase cycle, and such that only (fourth) clock signal CLKC is asserted during a third phase T13 of the three phase cycle. In the presently preferred embodiment, the clocking operation of D-flip-flops 162B-1, 162B-2 and 162B-3 is controlled by way of a clock signal, which in one embodiment is (first) clock signal CLK applied to voltage chopping circuit 150 in FIG. 1. With this arrangement, clock signals CLKA, CLKB, and CLKC are generated as a function of (first) clock signal CLK such that (second) clock signal CLKA is asserted high during an entire first (e.g., positive/high) phase of clock signal CLK (e.g., corresponding to time period T11 in FIG. 7(A)), (third) clock signal CLKB is asserted high during an entire subsequent second (e.g., negative/low) phase of clock signal CLK (e.g., corresponding to time period T12 in FIG. 7(A)), and (fourth) clock signal CLKC is asserted high during an entire subsequent (e.g., high) phase of said clock signal CLK (e.g., corresponding to time period T13 in FIG. 7(A)). Controlling three-phase clock generator 161B using clock signal CLK in this manner facilitates beneficial synchronization of the voltage chopping and current chopping operations.

Figure 8:
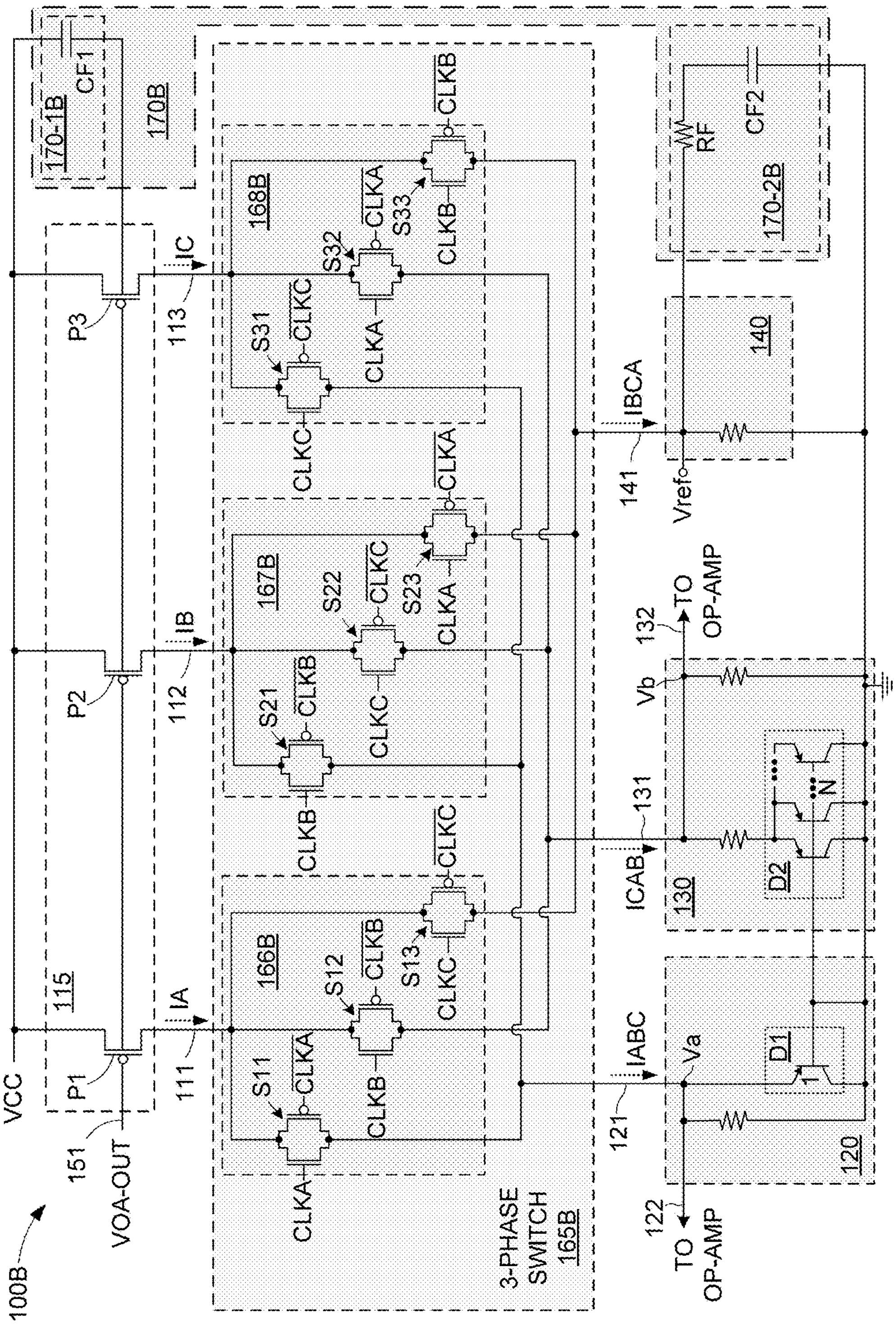
FIG. 8 is a simplified circuit diagram showing a three-phase switching circuit utilized by the BGR circuit of FIG. 1 according to another specific embodiment of the present invention.

FIG. 8 shows a portion of a BGR circuit 100B including a three-phase switching circuit 160-2B according to another exemplary embodiment. Three-phase switching circuit 165B is connected to current mirror 115 by way of signal lines 111, 112 and 113, and connected to stages 120, 130 and 140 by way of signal lines 121, 131 and 141, and includes three CMOS switch groups 166B, 167B and 168B that are configured to periodically alternately transmit balanced currents I1, I2 and I3 to stages 120, 130 and 140 in accordance with three-phase clock signals CLKA, CLKB and CLKC, which are generated, for example, using three-phase clock generator 161B (FIG. 6). First switch group 166B includes CMOS switches S11, S12 and S13 that are configured using the approach described above to couple (first) signal line 111 to CTAT stage 120 during each first phase (i.e., when clock signal CLKA is asserted and clock signals CLKB and CLKC are de-asserted), to couple signal line 111 to PTAT stage 130 during each second phase (i.e., when clock signal CLKB is asserted and clock signals CLKA and CLKC are de-asserted), and to couple signal line 111 to output stage 140 during each third phase of the three-phase cycle (i.e., when clock signal CLKC is asserted and clock signals CLKA and CLKB are de-asserted). Second switch group 167B includes CMOS switches S21, S22 and S23 that are configured to couple (second) signal line 112 to output stage 140 during each first phase, to CTAT stage 120 during each second phase, and to PTAT stage 130 during each third phase of the three-phase cycle. Third switch group 168B includes CMOS switches S31, S32 and S33 that are configured to couple (third) signal line 113 to PTAT stage 130 during each first phase, to output stage 140 during each second phase, and to CTAT stage 120 during each third phase of the three-phase cycle. Accordingly, during each three-phase cycle, the transmissions of currents I1, I2 and I3 are equally time-average distributed to each of stages 120, 130 and 140.

Figure 9A:
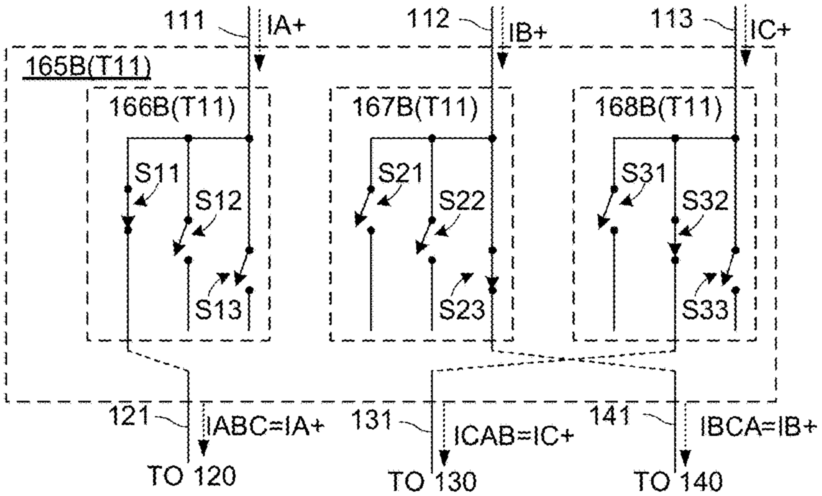
FIGS. 9(A), 9(B), 9(C), 9(D), 9(E) and 9(F) are simplified partial circuit diagrams showing alternate operating states of the three-phase switching circuit of FIG. 8.
Figure 9B:
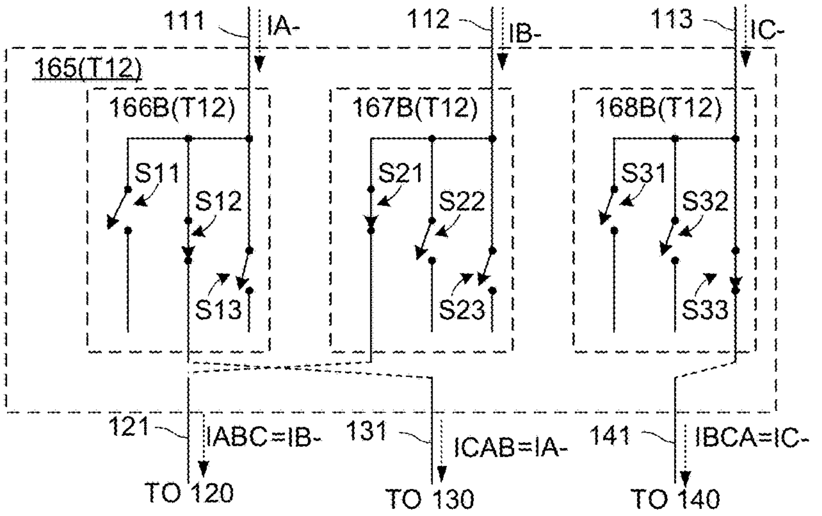
Figure 9C:
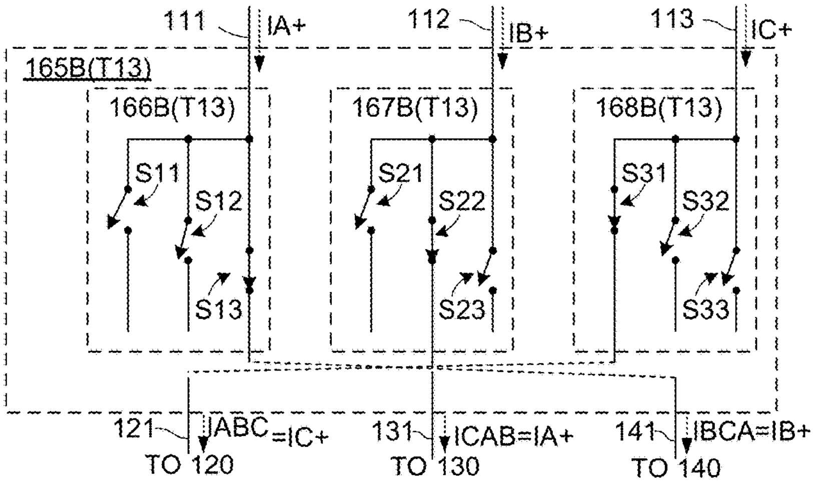

FIGS. 9(A) to 9(C) are simplified diagrams illustrating the switching operation of three-phase switching circuit 165B during an exemplary single three-phase cycle. FIG. 9(A) depicts the effective configuration of switching circuit 165B at a time T11 corresponding to each first phase of each three-phase cycle (i.e., when only clock signal CLKA is asserted), whereby first signal line 111, second signal line 112 and third signal line 113 are respectively coupled to CTAT (first) stage 120, output (third) stage 140 and PTAT (second) stage 130 stage. Specifically, signal line 111 is coupled by way of actuated switch S11 of switch group 166B to signal line 121, signal line 112 is coupled by way of actuated switch S23 of switch group 167B to signal line 141, and signal line 113 is coupled by way of actuated switch S32 of switch group 168B to signal line 131. FIG. 9(B) depicts the effective configuration of switching circuit 165B at a time T12 corresponding to each second phase of each three-phase cycle (i.e., when only clock signal CLKB asserted), whereby first signal line 111, second signal line 112 and third signal line 113 are respectively coupled to PTAT (second) stage 130 stage, CTAT (first) stage 120 and output (third) stage 140. Specifically, signal line 111 is coupled by way of actuated switch S12 of switch group 166B to signal line 131, signal line 112 is coupled by way of actuated switch S21 of switch group 167B to signal line 121, and signal line 113 is coupled by way of actuated switch S33 of switch group 168B to signal line 141. FIG. 9(C) depicts the effective configuration of switching circuit 165B at a time T13 corresponding to each third phase of each three-phase cycle (i.e., when only clock signal CLKC asserted), whereby first signal line 111, second signal line 112 and third signal line 113 are respectively coupled to output (third) stage 140, PTAT (second) stage 130, CTAT (first) stage 120. Specifically, signal line 111 is coupled by way of actuated switch S13 of switch group 166B to signal line 141, signal line 112 is coupled by way of actuated switch S22 of switch group 167B to signal line 131, and signal line 113 is coupled by way of actuated switch S31 of switch group 168B to signal line 121.

According to a presently preferred embodiment, a BGR circuit utilizes a double-chopping technique that combines and synchronizes the voltage and current chopping operations described above. In a practical exemplary embodiment, a double-chopping BGR circuit of the presently preferred embodiment combines three-phase switching circuit 165B (FIG. 8), three-phase clock generator 161B (FIG. 6), op-amp 110A (FIG. 2), op-amp input chopper 150-1A (FIG. 2) and op-amp output chopper 150-1B (FIG. 2). In this case, synchronizing the voltage and current chopping operations is achieved by controlling operation of three-phase clock generator 161B (FIG. 6) using the (first) clock signal CLK utilized by op-amp input chopper 150-1A and op-amp output chopper 150-1B (FIG. 2). Specifically, three-phase clock generator 161B (FIG. 6) is controlled by clock signal CLK (FIG. 7(A)) such that clock signals CLKA, CLKB and CLKC are generated as a function of clock signal CLK, where clock signal CLKA is asserted (high) during an entire positive (first) phase of clock signal CLK (i.e., as indicated in FIGS. 7(A) and 7(B)), clock signal CLKB is asserted during an entire subsequent negative (second) phase of clock signal CLK (i.e., as indicated in FIGS. 7(A) and 7(C)), and clock signal CLKC is asserted during an entire subsequent positive (third) phase of clock signal CLK.

Figure 9D:
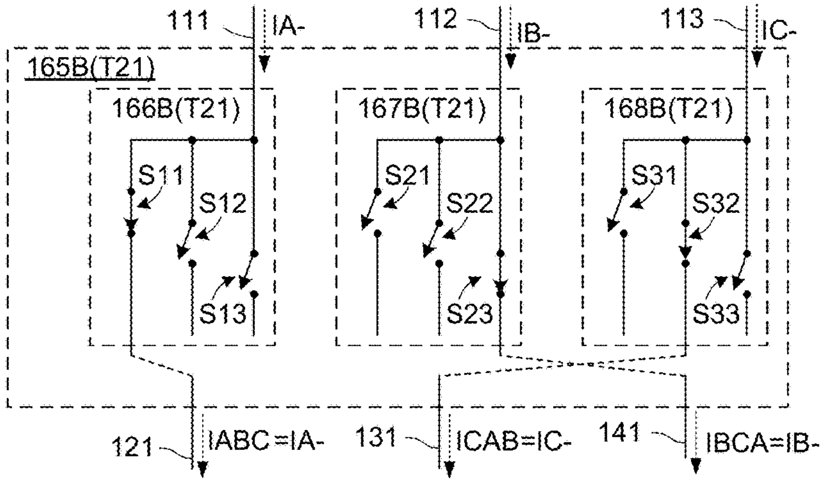
Figure 9E:
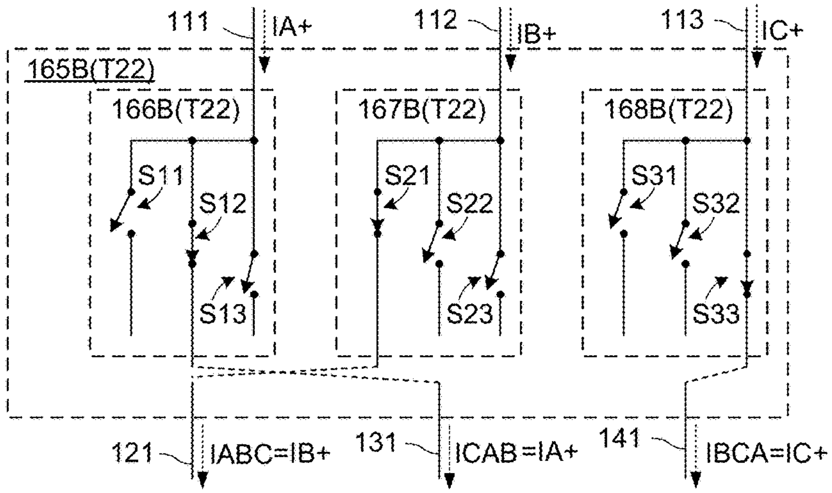
Figure 9F:
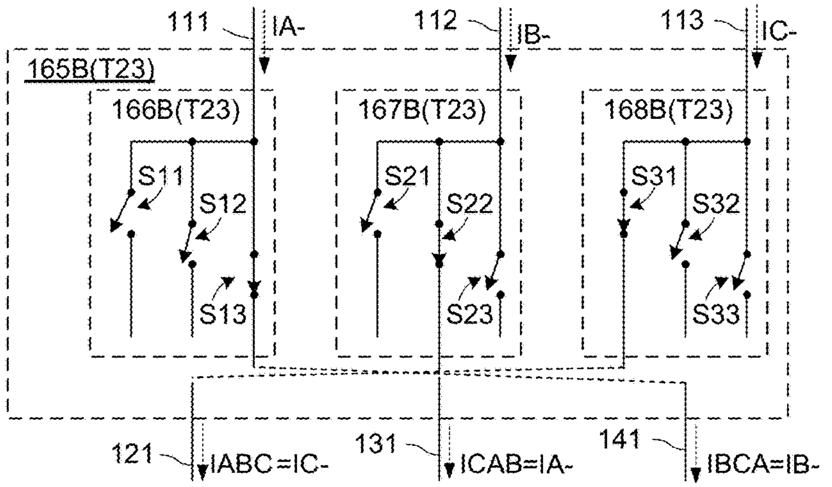

By synchronizing the three-phase current chopping operation with the two-phase voltage chopping operation, the preferred embodiment achieves full averaging of the alternating op-amp voltages and resulting current mirror currents. That is, as explained above with reference to FIGS. 5(A) and 5(B), the two-phase op-amp input voltage chopping operation performed by op-amp input chopper 150-1A and op-amp output chopper 150-1B causes op-amp 110A to alternatively generate positive phase output signals (i.e., VOA-OUT=OAO2, see FIG. 5(A)) during each positive phase of clock signal CLK, and negative phase output signals (i.e., VOA-OUT=OAO1, see FIG. 5(B)) during each negative phase of clock signal CLK). Because current mirror 120 generates currents I1, I2 and I3 in response to op-amp output signal VOA-OUT, current-mirror currents I1, I2 and I3 are effectively periodically alternately changed between two values (i.e., positive phase current values I1+, I2+ and I3+ corresponding to positive phase output signal OAO2 and negative phase current values I1−, I2− and I3− corresponding to negative phase output signal OAO2) during each two-phase voltage chopping cycle. Because each three-phase current-chopping operation is repeated every 1.5 cycles of the two-phase voltage chopping operation, positive phase current values I1+, I2+ and I3+ and negative phase currents I1−, I2− and I3− are alternated each sequential three-phase clock cycle. The alternating positive/negative phase cycle is illustrated in FIGS. 9(A) to 9(F), where FIGS. 9(A) to 9(C) show three-phase switching circuit 165B during a first phase/time period T11 (FIG. 9(A)), a second phase/time period T12 (FIG. 9(B), and a third phase/time period T13 (FIG. 9(C)) of a first three-phase cycle, and FIGS. 9(D) to 9(F) show three-phase switching circuit 165B during a first phase/time period T21 (FIG. 9(D)), a second phase/time period T22 (FIG. 9(E), and a third phase/time period T23 (FIG. 9(F)) of a subsequent (second) three-phase cycle. Note that the switch configurations shown in FIGS.

9(D), 9(E) and 9(F) are identical to those shown in FIGS. 9(A), 9(B) and 9(C), respectively. As indicated in FIG. 9(A), positive phase current values I1+, I2+ and I3+ are transmitted on signal lines 111, 112 and 113 during the first phase of the first cycle (see the upper portion of FIG. 9(A)), whereby negative phase current values I1−, I2− and I3− are transmitted on signal lines 111, 112 and 113 during the second phase (see FIG. 9(B)), and positive phase current values I1+, I2+ and I3+ are transmitted on signal lines 111, 112 and 113 during the third phase (see the upper portion of FIG. 9(C)). As indicated in the upper portion of FIG. 9(D), due to the misalignment of the two-phase voltage and three-phase current chopping cycles, the first phase of subsequent (second) three-phase cycle occurs when negative phase current values I1−, I2− and I3− are transmitted on signal lines 111, 112 and 113 (i.e., as compared with the positive phase currents present during the first phase of the first three-phase cycle, shown in FIG. 9(A)). Similarly, positive phase current values I1+, I2+ and I3+ are transmitted on signal lines 111, 112 and 113 during the second phase of the second cycle (see FIG. 9(E)), and negative phase current values I1−, I2− and I3− are transmitted on signal lines 111, 112 and 113 during the third phase of the second cycle (see the upper portion of FIG. 9(F)). It is easily determined that this pattern repeats every two current chopping operation cycles (e.g., during the next sequential three-phase current chopping, the misalignment of the two-phase voltage and three-phase current chopping cycles would again involve positive phase current values). In this manner, synchronizing the three-phase current chopping operation with the two-phase voltage chopping operation results in full averaging of the alternating op-amp voltages and resulting current mirror currents.

Figure 10:
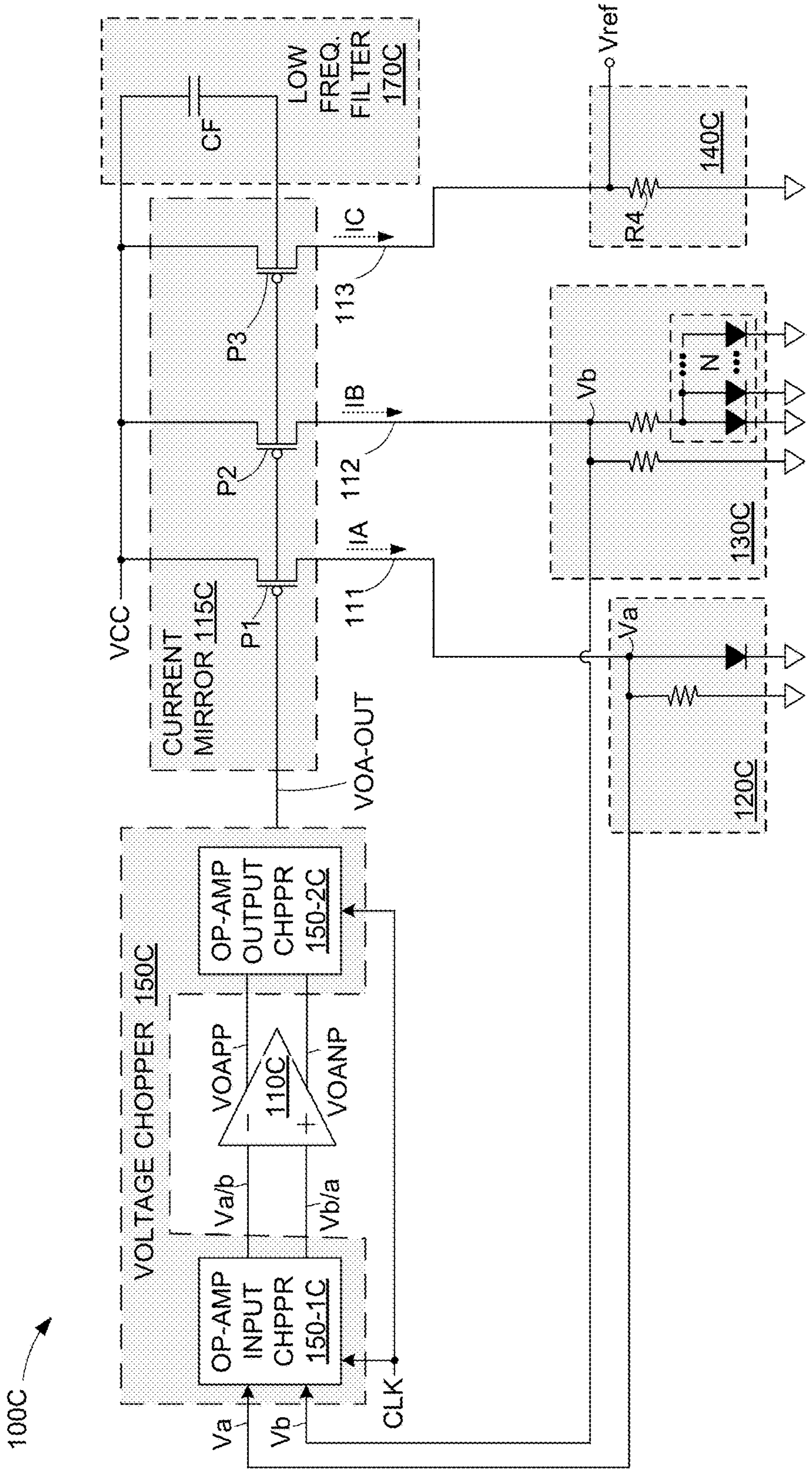
FIG. 10 is a simplified circuit diagram depicting a BGR circuit according to an alternative generalized exemplary embodiment of the present invention.
Figure 14:
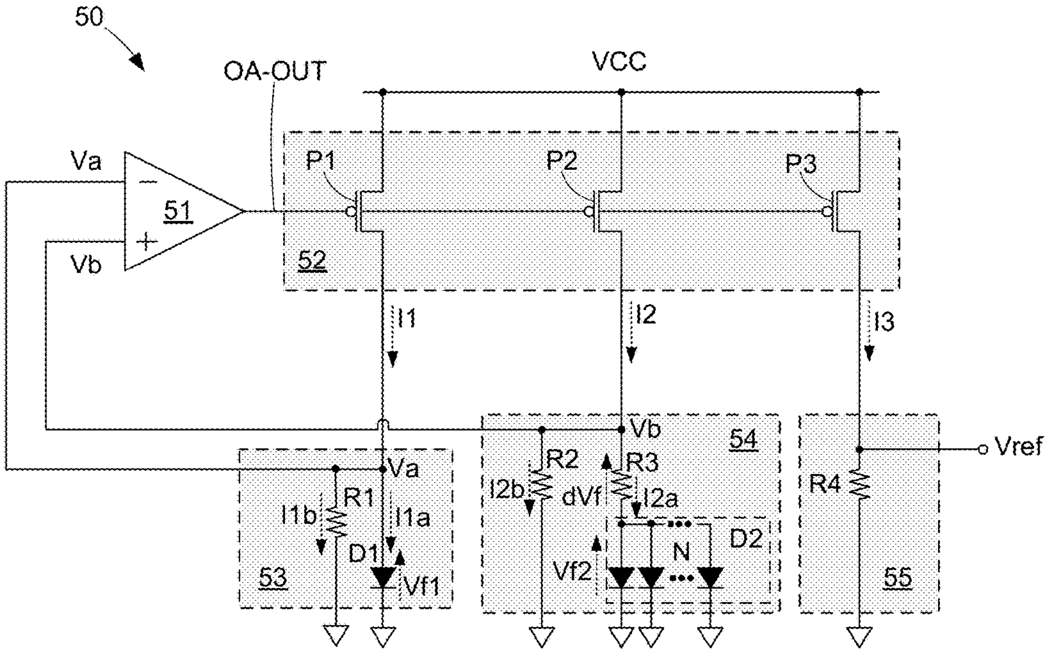
FIG. 14 is a simplified circuit diagram showing a conventional current-mode BGR circuit.

Although the presently preferred embodiment implements the double-chopping operation discussed above, a BGR circuit utilizing at least one of the voltage and current chopping techniques described herein. For example, FIG. 10 shows a BGR circuit 100C including voltage chopping circuit 150C and low-frequency filter 170C, where op-amp input chopper 150-1C is configured to time-average the transmission of negative temperature dependent voltage Va and temperature independent voltage Vb onto input terminals 110-IN+ and 110-IN− of op-amp 110C, and op-amp output chopper 150-2C is configured to transmit positive phase output signal OAO2 and negative phase output signal OAO1 onto gate signal line 151C in the manner described above. In this case, BGR circuit 100C omits a current chopping circuit, so current mirror circuit 110C is configured to transmit current I1 only to CTAT stage 120, to transmit current I1 only to CTAT stage 120, and to transmit current I3 only to output stage 140 in the manner utilized by conventional BGR circuit 50 (described above with reference to FIG. 14).

Figure 11A:
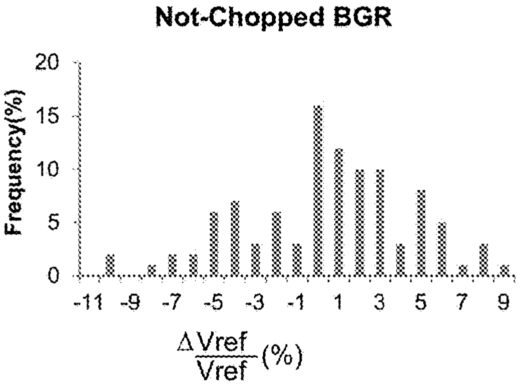
FIGS. 11(A), 11(B), 11(C) and 11(D) are bar graphs depicting calculated/measured frequency distributions generated by conventional BGR circuits and BGR circuits produced in accordance with the present invention.
Figure 11B:
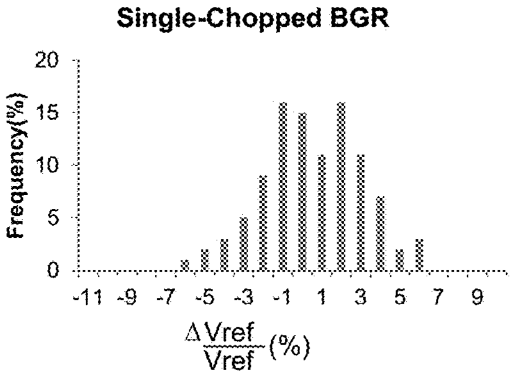
Figure 11C:
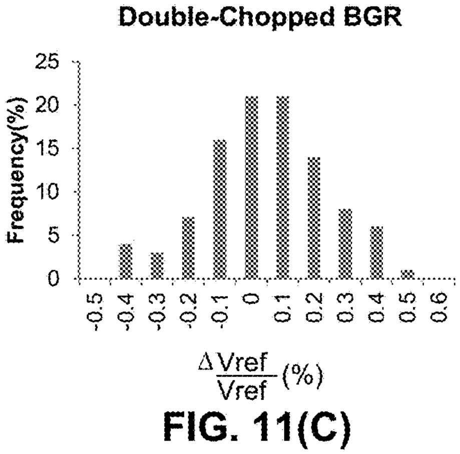
Figure 11D:
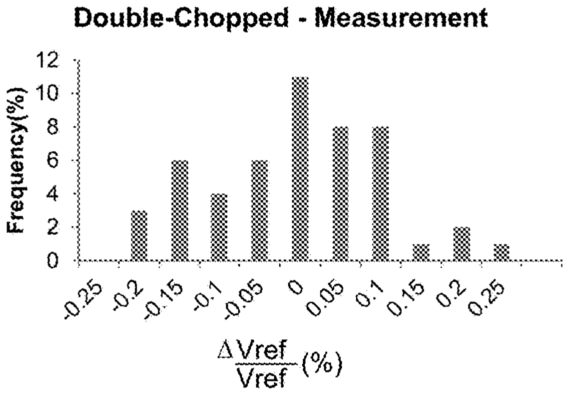
Figure 12:
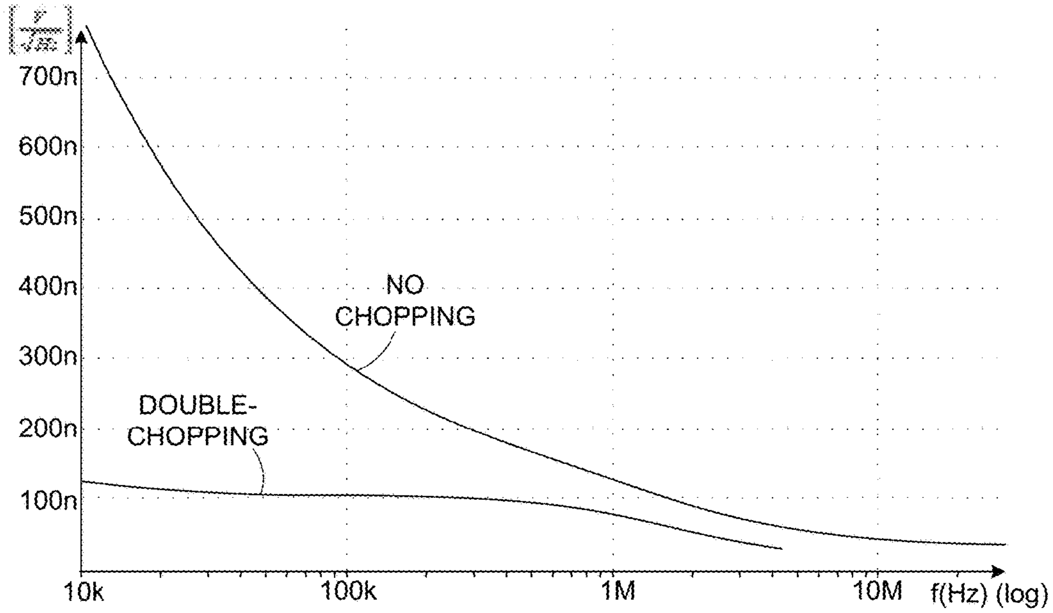
FIG. 12 is a simulated plot showing noise generated by the double-chopped and conventional (no-chopping) techniques over a frequency spectrum.

FIGS. 11(A), 11(B) and 11(C) are bar graphs depicting simulated performance of conventional current-mode BGR circuit 50 (FIG. 14), single-chopped BGR circuit 100C (FIG. 10) and a double-chopped BGR circuit fabricated in accordance with the presently preferred embodiment described above. The bar graphs depict the stability of reference voltage Vref by way of changes in Vref to an average value of Vref occurring over time during operation of each of the BGR circuits, with each bar indicating the percentage of time at which a particular difference was calculated. A comparison of FIGS. 11(A) and 11(B) indicates that the single-chopping approach produces modest improvements in the stability of reference voltage Vref (i.e., a reduction in the distribution scale from a range of −10 to +8 in FIG. 11(A) to a range of −6 to +6 in FIG. 11(B)), showing that implementing at least one of the voltage and current chopping techniques described herein provides improved BGR circuit performance. In contrast, FIG. 11(C) indicates that the double-chopped BGR circuits produced in accordance with the present invention provide an order-of-magnitude improvement in Vref stability (i.e., a reduction in the distribution scale from a range of −10 to +8 in FIG. 11(A) to a range of −0.4 to +0.4 in FIG. 11(C)). FIG. 11(D) shows results measured from an actual double-chopped BGR circuit that support the accuracy of the simulated results of FIGS. 11(A) to 11(C). FIG. 12 is a simulated plot comparing the double-chopped and conventional (no-chopping) techniques, and shows the amount of voltage noise at the output of the BGR circuits across frequency spectrum—this noise will contribute to variation of the generated reference voltage, and thus the less noise, the more stable is the generated reference voltage. As indicated in FIG. 12, the double-chopped technique exhibits a substantial reduction in noise over the entire frequency spectrum.

Figure 13:
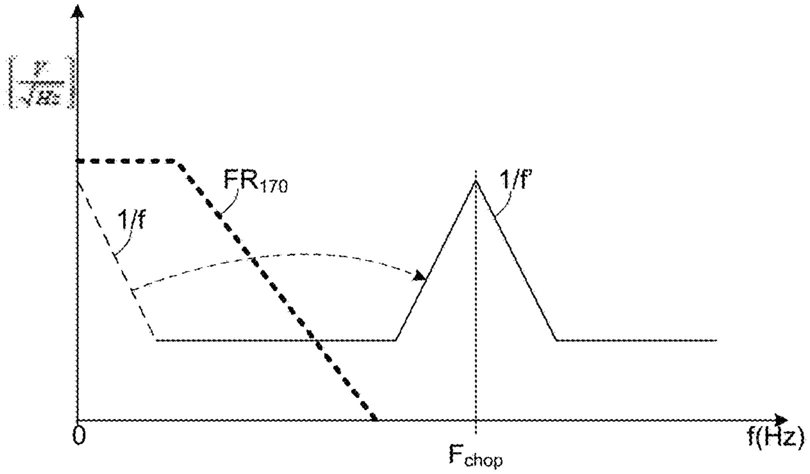
FIG. 13 is a simulated plot showing an output spectrum of a single- or double-chopped BGR circuit.

FIG. 13 is a plot showing an output spectrum for a single-chopped or double-chopped BGR circuit according to the embodiments set forth above, and depicts how noise reduction is achieved by BGR circuits formed in accordance with the present invention. Thick dashed line $FR_{170}$ represents the RC filter frequency response of filter 170, which has a cut-off frequency that is lower than the chopping frequency $f_{chop}$ (i.e., noise with frequencies higher than chopping frequency $F_{chop}$ are suppressed). As indicated by the dashed-line arrow, low-frequency 1/f noise is up-converted to noise 1/f' by way of swapping the op-amp input signals in the manner described above. That is, swapping the op-amp input signals up-converts the 1/f noise from from around 0 Hz to the (higher) swapping frequency $F_{chop}$, which is above the RC filter frequency response of filter 170, whereby up-converted noise 1/f' is then suppressed by the BGR circuits' filter (e.g., filter 170 in FIG. 1).

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A bandgap reference (BGR) circuit for generating a reference voltage, the BGR circuit comprising:

an operational amplifier (op-amp) having a first op-amp input terminal and a second op-amp input terminal;

a current mirror circuit including first, second and third transistors having first terminals connected to a voltage source and having gate terminals coupled by way of a gate control line to at least one output node of the op-amp such that the first, second and third transistors are controlled to respectively pass first, second and third currents to first, second and third signal lines in response to an op-amp output signal generated by said op-amp and transmitted on said gate control line;

a first stage coupled to said current mirror circuit and configured to generate a negative temperature dependent voltage in response to at least one of said first, second and third currents, said negative temperature dependent voltage being coupled to at least one of said first and second op-amp input terminals;

a second stage coupled to said current mirror circuit and configured to generate a positive temperature dependent voltage in response to at least one of one of said first, second and third currents, said positive temperature dependent voltage being coupled to at least one of said first and second op-amp input terminals;

a third stage coupled to said current mirror circuit and configured to generate said reference voltage in accordance with at least one of the first, second and third currents;

a voltage chopping circuit coupled to said op-amp, said voltage chopping circuit configured to periodically alternately apply said negative temperature dependent voltage and said positive temperature dependent voltage to said first and second op-amp input terminals, and a current chopping circuit connected to said first, second and third signal lines and configured to periodically alternately apply each of said first, second and third currents to said first, second and third stages such that transmission of each of said first, second and third currents is time-averaged between said first, second and third stages; and a filter configured to filter out noise generated by operation of said at least one of the voltage chopping circuit and the current chopping circuit, wherein said current chopping circuit comprises:

a three-phase clock generator configured to generate a second clock signal, a third clock signal, and a fourth clock signal such that only said second clock signal is asserted during a first phase of a three-phase cycle, such that only said third clock signal is asserted during a second phase of the three phase cycle, and such that only said fourth clock signal is asserted during a third phase of the three phase cycle, and a three-phase switching circuit connected between said first, second and third signal lines and said first, second and third stages and configured such that said first, second and third signal lines are respectively coupled to said first, third and second stages during said first phase of said three-phase cycle, such that said first, second and third signal lines are respectively coupled to said second, first and third stages during said second phase of said three-phase cycle, and such that said first, second and third signal lines are respectively coupled to said third, first and second stages during said third phase of said three-phase cycle, wherein said three-phase clock generator is configured to generate said second, third, and fourth clock signals as a function of said first clock signal such that said second clock signal is asserted during an entire first phase of said first clock signal, said third clock signal is asserted during an entire subsequent second phase of said first clock signal, and said fourth clock signal is asserted during an entire subsequent third phase of said first clock signal.

2. The BGR circuit of claim 1, wherein said voltage chopping circuit comprising:

an input voltage chopper coupled between said first and second op-amp input terminals and said first and second stages, said input voltage chopper configured such that said negative temperature dependent voltage and said positive temperature dependent voltage are respectively applied to said first and second op-amp input terminals during each first phase of a first clock signal, whereby the op-amp generates a first output signal during said each first phase, and such that said negative temperature dependent voltage and said positive temperature dependent voltage are respectively applied to said second and said first op-amp input terminals during each second phase of said first clock signal, whereby the op-amp generates a second output signal during said each second phase; and an output voltage chopper coupled between said op-amp and the gate control line, said output voltage chopper being configured to transmit said first output signal onto said gate control line during each said first phase, and to transmit said second output signal onto said gate control line during each said second phase.

3. The BGR circuit of claim 2, wherein said filter comprises an input filter connected between said gate control line and said voltage source, said input filter being configured to suppress low frequency noise generated by operation of said voltage chopping circuit.

4. The BGR circuit of claim 2, wherein said input voltage chopper comprises:

a first switch configured to pass said negative temperature dependent voltage to said first op-amp input terminal during each said first phase of said first clock signal, a second switch configured to pass said positive temperature dependent voltage to said first op-amp input terminal during each said second phase of said first clock signal, a third switch configured to pass said negative temperature dependent voltage to said second op-amp input terminal during each said second phase of said first clock signal, and a fourth switch configured to pass said positive temperature dependent voltage to said second op-amp input terminal during each said first phase of said first clock signal.

5. The BGR circuit of claim 4, wherein the op-amp comprises a one-stage op-amp circuit including:

first and second pull-down transistors respectively coupled between first and second output nodes and ground and having gate terminals that respectively form said first and second op-amp input terminals, and first and second pull-up transistors respectively coupled between a voltage source and said first and second output nodes;

wherein the first and second switches are operably connected to the gate terminal of the first pull-down transistor and the third and fourth switches are operably connected to the gate terminal of the second pull-down transistor such that said first output signal is generated on said second output node during said each first phase of said first clock signal, and such that said second output signal is generated on said first output node during each said second phase of said first clock signal, and wherein said output voltage chopper includes:

fifth and sixth switches configured to couple said second output node to said gate control line during each said first phase, and configured to couple said first output node to said gate control line during each said second phase, and seventh and eighth switches configured to couple gate terminals of the first and second pull-up transistors to said first output node during each said first phase, and configured to couple said gate terminals of the first and second pull-up transistors to said second output node during each said second phase.

6. The BGR circuit of claim 1, wherein said filter comprises:

an input filter connected between said gate control line and said voltage source, said input filter being configured to suppress low frequency noise generated by operation of said voltage chopping circuit; and an output filter coupled to the output stage and configured to reduce noise generated by operation of said current chopping circuit.

7. The BGR circuit of claim 1, wherein said three-phase clock generator comprises a ring counter circuit.

8. The BGR circuit of claim 1, wherein said three-phase switching circuit comprises:

a first switch group including a first plurality of switches configured to couple the first signal line to said first stage during each said first phase of said three-phase cycle, to couple the first signal line to said second stage during each said second phase of said three-phase cycle, and to couple the first signal line to said third stage during each said third phase of said three-phase cycle;

a second switch group including a second plurality of switches configured to couple the second signal line to said third stage during each said first phase of said three-phase cycle, to couple the second signal line to said first stage during each said second phase of said three-phase cycle, and to couple the second signal line to said second stage during each said third phase of said three-phase cycle; and a third switch group including a third plurality of switches configured to couple the third signal line to said second stage during each said first phase of said three-phase cycle, to couple the third signal line to said third stage during each said second phase of said three-phase cycle, and to couple the third signal line to said first stage during each said third phase of said three-phase cycle.

9. A bandgap reference (BGR) circuit for generating a reference voltage, the BGR circuit comprising:

an operational amplifier (op-amp) having a first op-amp input terminal and a second op-amp input terminal;

a current mirror circuit including first, second and third transistors having first terminals connected to a voltage source and having gate terminals coupled by way of a gate control line to at least one output node of the op-amp such that the first, second and third transistors are controlled to respectively pass first, second and third currents to first, second and third signal lines in response to an op-amp output signal generated by said op-amp and transmitted on said gate control line;

a first stage coupled to said current mirror circuit and configured to generate a negative temperature dependent voltage in response to at least one of said first, second and third currents, said negative temperature dependent voltage being coupled to at least one of said first and second op-amp input terminals;

a second stage coupled to said current mirror circuit and configured to generate a positive temperature dependent voltage in response to at least one of one of said first, second and third currents, said positive temperature dependent voltage being coupled to at least one of said first and second op-amp input terminals;

a third stage coupled to said current mirror circuit and configured to generate said reference voltage in accordance with at least one of the first, second and third currents;

a voltage chopping circuit including:

an input voltage chopper coupled between said op-amp and said first and second stages, said input voltage chopper configured to periodically alternately apply said negative temperature dependent voltage and said positive temperature dependent voltage to said first and second op-amp input terminals such that said negative temperature dependent voltage and said positive temperature dependent voltage are respectively applied to said first and second op-amp input terminals during a first time period, whereby the op-amp generates a first output signal during said first time period, and such that said negative temperature dependent voltage and said positive temperature dependent voltage are respectively applied to said second and said first op-amp input terminals during a second time period, whereby the op-amp generates a second output signal during said second time period; and an output voltage chopper coupled between said op-amp and the gate control line, said output voltage chopper being configured to transmit said first output signal onto said gate control line during said first phase, and to transmit said second output signal onto said gate control line during said second phase; and a current chopping circuit connected to said first, second and third signal lines and configured to periodically alternately apply each of said first, second and third currents to said first, second and third stages such that transmission of each of said first, second and third currents is time-averaged between said first, second and third stages, wherein said current chopping circuit comprises:

a three-phase clock generator configured to generate a second clock signal, a third clock signal, and a fourth clock signal such that only said second clock signal is asserted during a first phase of a three-phase cycle, such that only said third clock signal is asserted during a second phase of the three phase cycle, and such that only said fourth clock signal is asserted during a third phase of the three phase cycle, and a three-phase switching circuit connected between said first, second and third signal lines and said first, second and third stages and configured such that said first, second and third signal lines are respectively coupled to said first, third and second stages during said first phase of said three-phase cycle, such that said first, second and third signal lines are respectively coupled to said second, first and third stages during said second phase of said three-phase cycle, and such that said first, second and third signal lines are respectively coupled to said third, first and second stages during said third phase of said three-phase cycle, wherein said three-phase clock generator is configured to generate said second, third, and fourth clock signals as a function of said first clock signal such that said second clock signal is asserted during an entire first phase of said first clock signal, said third clock signal is asserted during an entire subsequent second phase of said first clock signal, and said fourth clock signal is asserted during an entire subsequent third phase of said first clock signal.

10. The BGR circuit of claim 9, further comprising a filter connected between said gate control line and said voltage source, said filter being configured to suppress low frequency noise generated by operation of said voltage chopping circuit.

11. The BGR circuit of claim 9, wherein said input voltage chopper comprises:

a first switch configured to pass said negative temperature dependent voltage to said first op-amp input terminal during said first time period, a second switch configured to pass said positive temperature dependent voltage to said first op-amp input terminal during said second time period, a third switch configured to pass said negative temperature dependent voltage to said second op-amp input terminal during said second time period, and a fourth switch configured to pass said positive temperature dependent voltage to said second op-amp input terminal during said first time period.

12. The BGR circuit of claim 11, wherein the op-amp comprises a one-stage op-amp circuit including first and second pull-down transistors respectively connected between first and second output nodes and ground and having gate terminals that respectively form said first and second op-amp input terminals, first and second pull-up transistors respectively coupled between a voltage source and said first and second output nodes such that said first output signal is generated on said second output node during said first time period, and such that said second output signal is generated on said first output node during said second time period, and wherein said output voltage chopper includes fifth and sixth switches configured to pass said first output signal to said gate control line during said first time period, and configured to pass said second output signal to said gate control line during said second time period.

13. The BGR circuit of claim 12, wherein the op-amp comprises a one-stage op-amp circuit including:

first and second pull-down transistors respectively connected between first and second output nodes and ground and having gate terminals that respectively form said first and second op-amp input terminals, and first and second pull-up transistors respectively coupled between a voltage source and said first and second output nodes, and wherein the first and second switches are operably connected to the gate terminal of the first pull-down transistor and the third and fourth switches are operably connected to the gate terminal of the second pull-down transistor such that said first output signal is generated on said second output node during said first time period, and such that said second output signal is generated on said first output node during each said second time period.

14. The BGR circuit of claim 9, wherein said output voltage chopper comprises:

fifth and sixth switches configured to couple said second output node to said gate control line during said first time period, and configured to couple said first output node to said gate control line during said second time period; and seventh and eighth switches configured to couple gate terminals of the first and second pull-up transistors to said first output node during said first time period, and configured to couple said gate terminals of the first and second pull-up transistors to said second output node during said second time period.

15. A bandgap reference (BGR) circuit for generating a reference voltage, the BGR circuit comprising:

an operational amplifier (op-amp) having a first op-amp input terminal and a second op-amp input terminal;

a current mirror circuit including first, second and third transistors having first terminals connected to a voltage source and having gate terminals coupled by way of a gate control line to at least one output node of the op-amp such that the first, second and third transistors are controlled to respectively pass first, second and third currents to first, second and third signal lines in response to an op-amp output signal generated by said op-amp and transmitted on said gate control line;

a first stage coupled to said current mirror circuit and configured to generate a negative temperature dependent voltage in response to at least one of said first, second and third currents, said negative temperature dependent voltage being coupled to at least one of said first and second op-amp input terminals;

a second stage coupled to said current mirror circuit and configured to generate a positive temperature dependent voltage in response to at least one of one of said first, second and third currents, said positive temperature dependent voltage being coupled to at least one of said first and second op-amp input terminals;

a third stage coupled to said current mirror circuit and configured to generate said reference voltage in accordance with at least one of the first, second and third currents; and a current chopping circuit connected to said first, second and third signal lines and configured to periodically alternately transmit said first, second and third currents to said first, second and third stages such that said first, second and third currents are respectively transmitted to said first, third and second stages during a first phase of a three-phase cycle, such that said first, second and third currents are respectively transmitted to said second, first and third stages during a second phase of a three-phase cycle, and such that said first, second and third currents are respectively transmitted to said third, first and second stages during a third phase of a three-phase cycle, wherein said current chopping circuit comprises a three-phase switching circuit connected between said first, second and third signal lines and said first, second and third stages and configured such that said first, second and third signal lines are respectively coupled to said first, third and second stages during said first phase of said three-phase cycle, such that said first, second and third signal lines are respectively coupled to said second, first and third stages during said second phase of said three-phase cycle, and such that said first, second and third signal lines are respectively coupled to said third, first and second stages during said third phase of said three-phase cycle, and wherein said current chopping circuit further comprises a ring counter circuit configured to generate a second clock signal, a third clock signal, and a fourth clock signal such that only said second clock signal is asserted during said first phase of said three-phase cycle, such that only said third clock signal is asserted during said second phase of the three phase cycle, and such that only said fourth clock signal is asserted during said third phase of said three phase cycle.

16. The BGR circuit of claim 15, wherein said three-phase switching circuit comprises:

a first switch group including a first plurality of switches configured to couple the first signal line to said first stage during each said first phase of said three-phase cycle, to couple the first signal line to said second stage during each said second phase of said three-phase cycle, and to couple the first signal line to said third stage during each said third phase of said three-phase cycle;

a second switch group including a second plurality of switches configured to couple the second signal line to said third stage during each said first phase of said three-phase cycle, to couple the second signal line to said first stage during each said second phase of said three-phase cycle, and to couple the second signal line to said second stage during each said third phase of said three-phase cycle; and a third switch group including a third plurality of switches configured to couple the third signal line to said second stage during each said first phase of said three-phase cycle, to couple the third signal line to said third stage during each said second phase of said three-phase cycle, and to couple the third signal line to said first stage during each said third phase of said three-phase cycle.

* * * * *